United States Patent
Takemura

(10) Patent No.: US 9,704,960 B2
(45) Date of Patent: Jul. 11, 2017

(54) FIELD EFFECT TRANSISTOR AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventor: Yasuhiko Takemura, Isehara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 15/216,016

(22) Filed: Jul. 21, 2016

(65) Prior Publication Data

US 2016/0329407 A1 Nov. 10, 2016

Related U.S. Application Data

(60) Division of application No. 15/062,594, filed on Mar. 7, 2016, now Pat. No. 9,425,199, which is a (Continued)

(30) Foreign Application Priority Data

Sep. 3, 2010 (JP) ................. 2010-197220

(51) Int. Cl.
*H01L 29/423* (2006.01)
*H01L 29/786* (2006.01)
(Continued)

(52) U.S. Cl.
CPC .... *H01L 29/42324* (2013.01); *H01L 27/1052* (2013.01); *H01L 29/0847* (2013.01);
(Continued)

(58) Field of Classification Search
CPC ............. H01L 27/1225; H01L 29/7881; H01L 29/0847; H01L 29/7869
See application file for complete search history.

(56) References Cited

U.S. PATENT DOCUMENTS

| 4,495,693 A | 1/1985 | Iwahashi et al. |
| 5,394,359 A | 2/1995 | Kowalski |

(Continued)

FOREIGN PATENT DOCUMENTS

| CN | 101378076 A | 3/2009 |
| EP | 1737044 A | 12/2006 |

(Continued)

OTHER PUBLICATIONS

Invitation to pay additional fees (Application No. PCT/JP2011/069362), International Searching Authority, Dated Sep. 27, 2011.
(Continued)

*Primary Examiner* — Cuong Q Nguyen
(74) *Attorney, Agent, or Firm* — Robinson Intellectual Property Law Office; Eric J. Robinson

(57) ABSTRACT

A structure with which the zero current of a field effect transistor using a conductor-semiconductor junction can be reduced is provided. A floating electrode (102) including a conductor or a semiconductor and being enclosed by an insulator (104) is formed between a semiconductor layer (101) and a gate (105) so as to cross the semiconductor layer (101) and the floating electrode (102) is charged, whereby carriers are prevented from flowing from a source electrode (103*a*) or a drain electrode (103*b*). Accordingly, a sufficiently low carrier concentration can be kept in the semiconductor layer (101) and thus the zero current can be reduced.

20 Claims, 9 Drawing Sheets

Related U.S. Application Data continuation of application No. 13/216,416, filed on Aug. 24, 2011, now Pat. No. 9,331,210.

(51) Int. Cl.
*H01L 29/08* (2006.01)
*H01L 29/788* (2006.01)
*H01L 27/105* (2006.01)
*H01L 27/108* (2006.01)

(52) U.S. Cl.
CPC ........ *H01L 29/788* (2013.01); *H01L 29/7869* (2013.01); *H01L 29/7881* (2013.01); *H01L 29/78633* (2013.01); *H01L 29/78696* (2013.01); *H01L 27/10873* (2013.01)

(56) References Cited

U.S. PATENT DOCUMENTS

| | | | |
|---|---|---|---|
| 5,646,428 A | 7/1997 | Hamada | |
| 5,714,795 A | 2/1998 | Ohmi et al. | |
| 5,731,856 A | 3/1998 | Kim et al. | |
| 5,744,864 A | 4/1998 | Cillessen et al. | |
| 5,818,083 A | 10/1998 | Ito | |
| 5,912,483 A | 6/1999 | Hamada | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,495,278 B2 | 2/2009 | Yamazaki et al. | |
| 7,501,293 B2 | 3/2009 | Ito et al. | |
| 7,646,643 B1 | 1/2010 | Lin | |
| 7,674,650 B2 | 3/2010 | Akimoto et al. | |
| 7,692,223 B2 | 4/2010 | Isobe et al. | |
| 7,732,819 B2 | 6/2010 | Akimoto et al. | |
| 7,994,588 B2 | 8/2011 | Yin et al. | |
| 8,003,981 B2 | 8/2011 | Iwasaki et al. | |
| 8,614,465 B2 | 12/2013 | Watanabe et al. | |
| 8,735,960 B2 | 5/2014 | Tran et al. | |
| 8,896,049 B2 | 11/2014 | Isobe et al. | |
| 9,331,210 B2 | 5/2016 | Takemura | |
| 9,425,199 B2 | 8/2016 | Takemura | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0222424 A1* | 11/2004 | Yamazaki ............ H01L 29/7881 257/72 |
| 2005/0017302 A1 | 1/2005 | Hoffman | |
| 2005/0139903 A1 | 6/2005 | Roizin et al. | |
| 2005/0199879 A1 | 9/2005 | Hoffman et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252233 A1 | 11/2007 | Yamazaki et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0057745 A1* | 3/2009 | Yin ........................ H01L 21/84 257/315 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2011/0156023 A1 | 6/2011 | Ieda | |
| 2011/0193078 A1 | 8/2011 | Takemura | |
| 2011/0256684 A1 | 10/2011 | Iwasaki et al. | |
| 2012/0248451 A1 | 10/2012 | Sone et al. | |

FOREIGN PATENT DOCUMENTS

| | | |
|---|---|---|
| EP | 2226847 A | 9/2010 |
| JP | 57-007162 A | 1/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |

(56) References Cited

FOREIGN PATENT DOCUMENTS

| | | |
|---|---|---|
| JP | 03-214779 A | 9/1991 |
| JP | 05-251705 A | 9/1993 |
| JP | 06-069515 A | 3/1994 |
| JP | 06-085279 A | 3/1994 |
| JP | 07-149688 A | 6/1995 |
| JP | 07-249688 A | 9/1995 |
| JP | 08-023039 A | 1/1996 |
| JP | 08-139197 A | 5/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-250983 A | 9/2007 |
| JP | 2007-318109 A | 12/2007 |
| JP | 2007-318112 A | 12/2007 |
| JP | 2009-060087 A | 3/2009 |
| JP | 2009-253159 A | 10/2009 |
| JP | 2010-186860 A | 8/2010 |
| JP | 2011-151370 A | 8/2011 |
| JP | 2012-074692 A | 4/2012 |
| KR | 2009-0022185 A | 3/2009 |
| WO | WO-2004/114391 | 12/2004 |
| WO | WO-2007/119386 | 10/2007 |
| WO | WO-2010/046997 | 4/2010 |
| WO | WO-2010/093051 | 8/2010 |
| WO | WO-2011/078398 | 6/2011 |
| WO | WO-2012/029674 | 3/2012 |

OTHER PUBLICATIONS

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

International Search Report (Application No. PCT/JP2011/069362) Dated Dec. 6, 2011.

Written Opinion (Application No. PCT/JP2011/069362) Dated Dec. 6, 2011.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May. 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Display", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al. "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

(56) References Cited

OTHER PUBLICATIONS

Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMo3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp, 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B.(Physical Review. B), 2008, Vol, 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide.TFT", AM-FPD '09 Digest of Technical Papers, Jul. 1, 2009, pp. 33-36.
Park.J et al., "Amorphous Indium—Gallium—Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development Qf 4.0-In. AMOLED Display With Driver Circuit Using Amorphous In—Ga—Zn—Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

(56) References Cited

OTHER PUBLICATIONS

Takahashi.M at al., "Theoretical Analysis of IGZO Transparent Amorphous Oxide Semiconductor", IDW '08 : Proceedings of the 15th International Display Workshops, Dec. 3, 2008, pp.1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner measuring initial characteristics accumulating electric charge measuring characteristics sealing with resin, and packaging

FIELD EFFECT TRANSISTOR AND METHOD FOR MANUFACTURING SEMICONDUCTOR DEVICE

TECHNICAL FIELD

The present invention relates to a field effect transistor (FET), a semiconductor circuit including an FET, and a semiconductor device including an FET or a semiconductor circuit.

BACKGROUND ART

An FET is a device in which regions called a source and a drain are provided in a semiconductor, each of the regions is provided with an electrode, potentials are supplied to the electrodes, and an electric field is applied to the semiconductor with the use of an electrode called a gate through an insulating film (called a gate insulating film) or a Schottky barrier so that the state of the semiconductor is controlled, whereby current flowing between the source and the drain is controlled. As the semiconductor, a Group 14 element such as silicon or germanium, a compound such as gallium arsenide, indium phosphide, gallium nitride, zinc sulfide, or cadmium telluride, or the like can be used.

In recent years, FETs in which an oxide such as zinc oxide or an indium gallium zinc oxide-based compound is used as a semiconductor have been reported (Patent Document 1 and Patent Document 2). In an FET including such an oxide semiconductor, relatively high mobility can be obtained, and such a material has a wide bandgap of 3 eV or more; therefore, application of the FET including an oxide semiconductor to displays, power devices, and the like is proposed.

The fact that the bandgap of such a material is 3 eV or more means that the material transmits visible light, for example; thus, in the case where the material is used in a display, even an FET portion can transmit light and the aperture ratio is expected to be improved.

Further, such a wide bandgap is common to silicon carbide, which is used in power devices; therefore, the oxide semiconductor is also expected to be applied to a power device.

Furthermore, a wide bandgap means few thermally excited carriers. For example, silicon has a bandgap of 1.1 eV at room temperature and thus thermally excited carriers exist therein at approximately $10^{11}/cm^3$, while in a semiconductor with a bandgap of 3.2 eV, thermally excited carriers exist at approximately $10^{-7}/cm^3$ according to calculation.

In the case of silicon, carriers generated by thermal excitation exist as described above even in silicon including no impurities, and thus the resistivity of the silicon cannot be $10^5$ Ωcm or higher at room temperature. In contrast, in the case of the semiconductor with a bandgap of 3.2 eV, a resistivity of $10^{20}$ Ωcm or higher can be obtained in theory. When an FET is manufactured using such a semiconductor and its high resistivity in an off state (a state where the potential of a gate is the same as the potential of a source) is utilized, it is expected that electric charge can be retained semipermanently.

Meanwhile, there are few reports on an oxide semiconductor which includes zinc or indium in particular and has p-type conductivity. Therefore, an FET using a PN junction like an FET including silicon has not been reported. As disclosed in Patent Document 1 and Patent Document 2, a source and a drain are formed with the use of a conductor-semiconductor junction in which a conductor electrode or the like is in contact with an n-type or i-type oxide semiconductor (in this specification, an "i-type semiconductor" refers to a semiconductor having a carrier concentration of $10^{12}/cm^3$ or lower) (such a junction is generally called a metal-semiconductor junction or a metal-insulator junction in academic books; in this specification, the term "conductor-semiconductor junction" is used for accurate interpretation of the term).

REFERENCE

Patent Document

[Patent Document 1] United States Patent Application Publication No. 2005/0199879
[Patent Document 2] United States Patent Application Publication No. 2007/0194379

DISCLOSURE OF INVENTION

In an FET where a source and a drain are formed with the use of a conductor-semiconductor junction, when the carrier concentration of the semiconductor is high, current (off-state current: in this specification, off-state current refers to current flowing between a source and a drain when the potential of a gate is lower than or equal to the potential of the source) flows between the source and the drain even in an off state. Therefore, the off-state current needs to be reduced by lowering the carrier concentration in the semiconductor so that an i-type semiconductor is obtained. However, it is apparent from consideration by the inventor that such an attempt does not work when the channel length of an FET is short or when a semiconductor layer or an insulating film between a gate and the semiconductor layer is thick.

In a conductor-semiconductor junction, in general, an ohmic junction or a Schottky barrier junction is formed depending on the relation between the work function of a conductor and the electron affinity (or the Fermi level) of a semiconductor. For example, if an ideal conductor-semiconductor junction (a junction where no trap level or compound is formed at the interface) is formed by making a conductor with a work function of 3.9 eV in contact with a semiconductor with an electron affinity of 4.3 eV, electrons flow from the conductor into the semiconductor.

In that case, a region closer to the junction interface between the conductor and the semiconductor has a higher electron concentration in the semiconductor, and the electron concentrations are approximately $10^{20}/cm^3$ at several nanometers from the interface of the conductor-semiconductor junction, approximately $10^{18}/cm^3$ at several tens of nanometers from the interface, approximately $10^{16}/cm^3$ at several hundreds of nanometers from the interface, and approximately $10^{14}/cm^3$ even at several micrometers from the interface according to rough calculation. That is, even when the semiconductor itself is an i-type semiconductor, contact with a conductor produces a region with a high carrier concentration. As a result of formation of such a region including many carriers in the vicinity of the interface of the conductor-semiconductor junction, the conductor-semiconductor junction becomes an ohmic junction.

In contrast, for example, if an ideal conductor-semiconductor junction is formed by making a conductor with a work function of 4.9 eV in contact with a semiconductor with an electron affinity of 4.3 eV, electrons existing in the semiconductor move to the conductor. In a region which the electrons have left, the electron concentration is, as is obvious, extremely low. The width of the region of the semiconductor to which electrons move depends on the electron concentration of the semiconductor; for example, when the original electron concentration of the semiconductor is $10^{18}/cm^3$, the width is approximately several tens of nanometers.

The electron concentration in this portion becomes significantly low; accordingly, a barrier is formed at the junction interface between the conductor and the semiconductor in a band diagram. A conductor-semiconductor junction including such a barrier is referred to as a Schottky barrier junction. Electrons easily flow from the semiconductor to the conductor, whereas electrons are less likely to flow from the conductor to the semiconductor owing to the barrier. Therefore, rectification action is observed in the Schottky barrier junction.

A similar phenomenon occurs even when a conductor is not in direct contact with a semiconductor. For example, even in the case where an insulating film is provided between a semiconductor and a conductor, the electron concentration of the semiconductor is influenced by the conductor. Needless to say, the degree of the influence of the conductor depends on the thickness and the dielectric constant of the insulating film. When the thickness of the insulating film is increased or when the dielectric constant thereof is lowered, the influence of the conductor is reduced.

It is preferable that a junction between a source and a semiconductor or between a drain and the semiconductor be formed so that current flows easily; thus, in an FET as disclosed in Patent Document 1 or Patent Document 2, a conductor material is selected so that an ohmic junction is formed. For example, titanium and titanium nitride are given. When a junction between an electrode and a semiconductor is an ohmic junction, there are advantages of stable characteristics of an FET to be obtained and of high percentage of non-defective products.

As a material for a gate, a material having effect of eliminating electrons from a semiconductor is selected. For example, a material with a high work function, such as tungsten or platinum, is selected. When such a material is used and the ratio L/T is 10 or more, where L is a channel length (typically, the distance between a source electrode and a drain electrode) and T (hereinafter referred to as a typical thickness) is the sum of the effective thicknesses of a gate insulating film and the semiconductor, an FET having an off-state current in the case where the potential of the gate is equal to that of the source (hereinafter referred to as zero current) of $1\times10^{-16}$ A or lower can be manufactured. Here, T is calculated by the following formula: T=(the thickness of a gate insulating film×the dielectric constant of a semiconductor/the dielectric constant of the gate insulating film)+the thickness of the semiconductor.

That is, when L is made larger and T is made smaller, an FET with lower zero current can be obtained. However, L gets smaller as the size of the device is reduced; for example, when the gate insulating film is too thin, leakage current due to tunneling current is generated. Moreover, it is technically difficult to obtain an extremely thin gate insulating film or semiconductor. On the other hand, for an application to a power device, the thickness of the gate insulating film needs to be increased in order to increase withstand voltage.

Thus, when the ratio L/T is decreased, especially when the ratio L/T is 4 or less, it is impossible to keep zero current lower than that of an FET including a silicon semiconductor. A cause of that phenomenon is described with reference to FIGS. 2A to 2C. FIG. 2A illustrates a typical structure of an FET including a conductor-semiconductor junction. Specifically, a source electrode 103a and a drain electrode 103b are provided on one surface of a semiconductor layer 101. Further, an insulator 104 functioning as a gate insulating film and a gate 105 are provided over the opposite surface of the semiconductor layer 101.

A conductor is selected for the source electrode 103a and the drain electrode 103b so that ohmic junctions are formed between the source electrode 103a and the semiconductor layer 101 and between the drain electrode 103b and the semiconductor layer 101. In addition, by using a material whose work function is higher than the electron affinity of the semiconductor for the gate 105, electrons flowing from the source electrode 103a or the drain electrode 103b are eliminated.

An effect of the source electrode 103a, the drain electrode 103b and an effect of the gate 105 at a position are thought to depend on respective distances from the source electrode 103a or the drain electrode 103b and the gate 105 at the position. In order to simplify the explanation, it is assumed that a force of the source electrode 103a or the drain electrode 103b for injecting electrons into the semiconductor layer 101 is equal to a force of the gate 105 for eliminating electrons from the semiconductor layer 101. That is, at a position in the semiconductor layer 101 where the distances from the source electrode 103a, the drain electrode 103b and the gate 105 are equal, the opposing forces are balanced; thus, the electron concentration therein is equal to an original value.

At a position which is closer to the source electrode 103a or the drain electrode 103b than the gate 105, the source electrode 103a or the drain electrode 103b has a stronger effect, and the electron concentration is higher at the position. In contrast, at a position which is closer to the gate 105 than the source electrode 103a or the drain electrode 103b, the gate 105 has a stronger effect, and the electron concentration is lower at the position.

Here, it should be noted that the distance in this case means not a spatial distance but an electromagnetic distance; therefore, the comparison needs to be made on the basis of a value obtained by multiplying a spatial distance by a dielectric constant.

FIG. 2B illustrates conceptual isoconcentration lines of the electron concentration in the semiconductor layer 101 of the FET in FIG. 2A, which is based on the above premise. In order to simplify the explanation, the dielectric constant of the insulator 104 is assumed to be equal to the dielectric constant of the semiconductor layer 101. In addition, the potentials of the source electrode 103a and the drain electrode 103b are equal to the potential of the gate 105.

There are regions 101a where the electron concentration is high in the vicinity of an interface between the semiconductor layer 101 and the source electrode 103a and the drain electrode 103b. Further, regions 101b where the electron concentration is lower than the electron concentration in the regions 101a by approximately one order of magnitude, regions 101c where the electron concentration is lower than that in the regions 101b by approximately one order of magnitude, a region 101d where the electron concentration is lower than that in the regions 101c by approximately one order of magnitude, and a region 101e where the electron concentration is lower than that in the region 101d exist outside the regions 101a in this order.

It should be noted that the region 101d is not divided on a surface of the semiconductor layer 101 which is opposite to the gate 105. This is because the force of the gate 105 does not reach that region and electrons are injected by the forces of the source electrode 103a and the drain electrode 103b.

In the drawing, the ratio L/T is a little less than 2. Assuming that the distance between the source electrode 103a and the drain electrode 103b is 120 nm, the thickness of the semiconductor layer 101 is 50 nm; thus, the electron concentration on the isoconcentration line between the region 101a and the region 101b is approximately $10^{20}/cm^3$, and the electron concentration on the isoconcentration line between the region 101d and the region 101e is approximately $10^{17}/cm^3$.

Assuming that the distance between the source electrode 103a and the drain electrode 103b is 1.2 μm, the thickness of the semiconductor layer 101 is 0.5 μm; thus, the electron concentration on the isoconcentration line between the region 101a and the region 101b is approximately $10^{18}/cm^3$, and the electron concentration on the isoconcentration line between the region 101d and the region 101e is approximately $10^{15}/cm^3$.

Although an electron concentration of $10^{15}/cm^3$ seems low enough, the value is approximately 1 kΩcm in resistivity. As illustrated in the drawing, in one third or more part of the semiconductor layer, the electron concentration is $10^{15}/cm^3$ or higher. Accordingly, in an FET in which the channel length and the channel width are equal, the resistance is approximately 10 MΩ and the zero current is as high as 0.1 μA in the case where the potential difference between the source electrode 103a and the drain electrode 103b is 1 V.

In short, in order to reduce the zero current, the electron concentration on the side opposite to the gate needs to be prevented from being such an unignorable value. For that purpose, a method in which the thickness of the semiconductor layer 101 is reduced can be considered. In other words, a region which is not influenced by the gate 105 may be reduced. In the case of the FET in the drawing, the thickness of the semiconductor layer 101 may be reduced to 75%. Calculation results indicate that the zero current can be reduced to one hundred-thousandth when the thickness of the semiconductor layer 101 is reduced by half, for example.

However, in an extremely small device in which the distance between the source electrode 103a and the drain electrode 103b is 24 nm, for example, the thickness of the semiconductor layer 101 needs to be 3.75 nm or less (e.g., 2.5 nm or less), and thus it is technically difficult to uniformly form the semiconductor layer 101 with such a small thickness.

A second method is to make the insulator 104 thinner. When the thickness of the insulator 104 in the drawing is reduced to one sixth or less, the influence of the gate 105 can reach the back surface of the semiconductor layer 101. However, as in the above example, when the distance between the source electrode 103a and the drain electrode 103b is 24 nm, the insulator 104 needs to have a thickness of 0.8 nm or less.

A gate insulating film is formed over an oxide semiconductor by a sputtering method or a CVD method. It is difficult to form, by these methods, an insulating film having high quality and a uniform thickness like an insulating film of silicon formed by a thermal oxidation method; therefore, these methods are not realistic. Furthermore, an insulating film with a thickness of 1 nm or less causes a problem of leakage current due to tunneling current, even if it is formed by a thermal oxidation method and has high quality.

When the leakage current between the source electrode and the gate or between the drain electrode and the gate is higher than or equal to the current between the source electrode and the drain electrode, even if the latter is extremely low, the FET cannot be used for holding of electric charge. Even in the case where the FET is used for another purpose, leakage current causes an increase in power consumption, which is unfavorable.

It is apparent from calculation that a relation between the gate voltage ($V_G$) and the drain current ($I_D$) (an $I_D$-$V_G$ curve) of an FET exhibits channel length dependence as shown in FIG. 2C. In FIG. 2C, a curve 114, a curve 115, and a curve 116 are each an $I_D$-$V_G$ curve of an FET in which the channel length is equal to the channel width. Here, the typical thickness T is a constant value. Note that the curves in FIG. 2C are shown for clear explanation of change in characteristics of the FET and are not obtained by actual measurement.

In an ideal FET in which the channel length is equal to the channel width, the on-state current does not change depending on the channel length, whereas the threshold voltage or the subthreshold characteristic value changes in some cases. This phenomenon is known as a short channel effect in a normal MOSFET as well. As shown in FIG. 2C, in an FET including a conductor-semiconductor junction, the threshold voltage or the subthreshold characteristic value (S value) changes depending on the channel length.

That is, the curve 116 shows characteristics of an FET having a relatively large channel length. The curve 115 shows characteristics of an FET having a channel length which is approximately 1/10 of that in the case of the curve 116. The curve 114 shows characteristics of an FET having a channel length which is approximately 1/100 of that in the case of the curve 116. Thus, as the channel length is decreased, the drain current in the case where the voltage of a gate is set to 0 V to be the same as the voltage of a source (i.e., zero current) is increased and the curve becomes gentler (the S value is increased).

The above consideration is based on the premise that the force of the source electrode 103a or the drain electrode 103b for injecting electrons into the semiconductor layer 101 is equal to the force of the gate 105 for eliminating electrons from the semiconductor layer 101. When the former force is stronger than the latter force, more electrons are injected from the source electrode 103a or the drain electrode 103b into the semiconductor layer 101.

In view of the above-described problems, the present invention is made. An object of one embodiment of the present invention is to provide at least one of the following: a novel semiconductor device including a conductor-semiconductor junction; a novel FET including a conductor-semiconductor junction; a method for manufacturing the novel semiconductor device; and a method for manufacturing the novel FET.

Another object of one embodiment of the present invention is to provide a method which is effective to the above-described problem in that the zero current of an FET including a conductor-semiconductor junction is increased by changing the size of the FET. In particular, it is an object to provide a novel structure with which the zero current of an FET, where the ratio L/T is 4 or less or L is less than 100 nm, becomes low enough for practical use. According to one embodiment of the present invention, at least one of the above objects is achieved.

The present invention will be described below; terms used in this specification are briefly explained. First, as for a source and a drain of an FET in this specification, a terminal supplied with a higher potential is referred to as a drain and the other terminal is referred to as a source in an n-channel FET, and a terminal supplied with a lower potential is referred to as a drain and the other terminal is referred to as a source in a p-channel FET. In the case where the same potential is supplied to the two terminals, one of them is referred to as a source and the other is referred to as a drain. In addition, the terms "first conductor electrode" and "second conductor electrode" are used instead of the terms "source electrode" and "drain electrode" in some cases. In that case, the names are not changed depending on the level of a potential.

One embodiment of the present invention is an FET including a semiconductor layer, first and second conductor electrodes provided in contact with one surface of the semiconductor layer, a gate provided over the one surface or another surface of the semiconductor layer, and a floating electrode between the semiconductor layer and the gate. The floating electrode includes a conductor or a semiconductor, is enclosed by an insulator, and is charged with a given amount of electric charge. The floating electrode is provided so as to cross the semiconductor layer. No PN junction exists in the FET.

One embodiment of the present invention is an FET including a semiconductor layer, first and second conductor electrodes provided in contact with one surface of the semiconductor layer, a gate provided over the one surface or another surface of the semiconductor layer, and a floating electrode between the semiconductor layer and the gate. The floating electrode includes a conductor or a semiconductor, is enclosed by an insulator, and is charged with a given amount of electric charge. The floating electrode is provided so as to cross the semiconductor layer. In the FET, conductor-semiconductor junctions exist between the first and second conductor electrodes and the semiconductor layer.

In either of the above structures, it is preferable that a semiconductor device including the FET do not include a circuit for charging the floating electrode. In either of the above structures, it is preferable that the amount of electric charge accumulated in the floating electrode cannot be changed by a user after completion of the manufacturing process.

One embodiment of the present invention is a method for manufacturing a semiconductor device, which includes the steps of forming a semiconductor circuit including an FET, charging a floating electrode, and then covering the semiconductor circuit with a light-blocking material. The FET includes a semiconductor layer, first and second conductor electrodes provided in contact with one surface of the semiconductor layer, a gate provided over the one surface or another surface of the semiconductor layer, and the floating electrode between the semiconductor layer and the gate. The floating electrode includes a conductor or a semiconductor and is enclosed by an insulator. The floating electrode is provided so as to cross the semiconductor layer.

One embodiment of the present invention is a method for manufacturing a semiconductor device, which includes the steps of forming a semiconductor circuit including an FET and charging a floating electrode by application of voltage from the outside through a pad provided in the semiconductor circuit. The FET includes a semiconductor layer, first and second conductor electrodes provided in contact with one surface of the semiconductor layer, a gate provided over the one surface or another surface of the semiconductor layer, and the floating electrode between the semiconductor layer and the gate. The floating electrode includes a conductor or a semiconductor and is enclosed by an insulator. The floating electrode is provided so as to cross the semiconductor layer.

In any of the above structures, in the case where the FET is an n-channel FET, the floating electrode is preferably negatively charged; in the case where the FET is a p-channel FET, the floating electrode is preferably positively charged.

The semiconductor layer may be an oxide in which any of the proportion of indium (In) to all metal elements, the proportion of zinc (Zn) to all metal elements, and the proportion of In and Zn to all metal elements is 25% or higher. The semiconductor layer may be an oxide with a bandgap greater than or equal to 3.0 eV and less than or equal to 4.5 eV. The semiconductor layer may be a compound of a Group 16 element, such as a sulfide.

An oxide in this specification is a substance (including a compound) in which the proportion of nitrogen, oxygen, fluorine, sulfur, selenium, chlorine, bromine, tellurium, and iodine (in a molar ratio) is higher than or equal to 25% of the total and the proportion of oxygen to the above elements (in a molar ratio) is higher than or equal to 70%.

A metal element in this specification refers to all elements other than a rare gas element, hydrogen, boron, carbon, nitrogen, a Group 16 element (e.g., oxygen), a Group 17 element (e.g., fluorine), silicon, phosphorus, germanium, arsenic, and antimony.

Further, in this specification, "one element (or metal element) is a main component (or metal component)" indicates the case where among a plurality of elements (or metal elements) in a substance, the proportion of the element (or metal element) to all the elements (or metal elements) is 50% or higher. In addition, "n kinds of elements (or metal elements) $M_1$, $M_2$, . . . $M_n$ are main components (or metal components)" indicates the case where the sum of the proportions of the elements (or metal elements) $M_1$, $M_2$, . . . $M_n$ to all the elements (or metal elements) is $\{(1-2^{-n})\times100\}$ [%] or higher.

Note that the concentration of an element which is not a main component in a film denoted in this specification is a minimum value of a concentration detected by secondary ion mass spectrometry unless otherwise specified. In general, when the concentration of an element in a depth direction of a single-layer or multilayer film is measured by secondary ion mass spectrometry, particularly in the case of a microelement, the concentration of the element tends to be unusually high at an interface between a substrate and the film or between the film and another film; the concentration of such a portion is not an accurate value and measurement variations are large.

In the case where an oxide semiconductor is used for the semiconductor layer, the oxide semiconductor preferably includes at least In or Zn. In particular, In and Zn are preferably included. As a stabilizer for reducing variation in electric characteristics of a transistor including the oxide, gallium (Ga) is preferably additionally included. Tin (Sn) is preferably included as a stabilizer. Hafnium (Hf) is preferably included as a stabilizer. Aluminum (Al) is preferably included as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be included.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide including In, Ga, and Zn as main metal components and there is no particular limitation on the ratio of In, Ga, and Zn. The In—Ga—Zn-based oxide may include a metal element other than In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having an appropriate composition may be used in accordance with necessary semiconductor characteristics (such as mobility, threshold voltage, and variation). In order to obtain necessary semiconductor characteristics, it is preferable that the carrier concentration, the impurity concentration, the defect density, the atomic ratio of a metal element to oxygen, the interatomic distance, the density, and the like be set to be appropriate.

For example, with the In—Sn—Zn-based oxide, high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a portion having crystallinity or a non-amorphous structure.

In an oxide semiconductor in an amorphous state, a flat surface can be obtained relatively easily, so that when a transistor is manufactured with the use of the oxide semiconductor, interface scattering can be reduced and relatively high mobility can be obtained relatively easily.

In an oxide semiconductor having crystallinity, defects in the bulk can be further reduced, and mobility higher than that of an amorphous oxide semiconductor can be obtained by increasing the surface planarity. In order to increase the surface planarity, the oxide semiconductor is preferably formed over a flat surface. Specifically, the oxide semiconductor may be formed over a surface with an average surface roughness (Ra) of 1 nm or less, preferably 0.3 nm or less, further preferably 0.1 nm or less. Note that Ra is obtained by expanding centerline average roughness, which is defined by JIS B 0601, into three dimensions so as to be applicable to a surface.

Further, in any of the above structures, the semiconductor layer may be doped to have a first doped region and a second doped region which include carriers at a high concentration. In addition, the first doped region may be in contact with the first conductor electrode, and the second doped region may be in contact with the second conductor electrode. The carrier concentration in the first and second doped regions may be set to be higher than or equal to $1 \times 10^{18}/cm^3$ and lower than $1 \times 10^{21}/cm^3$, preferably higher than or equal to $1 \times 10^{19}/cm^3$ and lower than $1 \times 10^{29}/cm^3$.

In any of the above structures, it is preferable that portions of the first and second conductor electrodes, which are in contact with the semiconductor layer, each have a work function lower than the sum of the electron affinity of the semiconductor layer and 0.3 eV (i.e., the electron affinity+0.3 eV). Alternatively, it is preferable that ohmic junctions be formed between the first and second conductor electrodes and the semiconductor layer. In addition, it is not necessary that the first conductor electrode and the second conductor electrode are formed using the same material.

Note that the term "source electrode" may be used to denote the first conductor electrode, and the term "drain electrode" may be used to denote the second conductor electrode; the term "drain electrode" may be used to denote the first conductor electrode, and the term "source electrode" may be used to denote the second conductor electrode.

In any of the above structures, the work function of a material included in the floating electrode is preferably higher than the work function of the first conductor electrode or the work function of the second conductor electrode by 0.6 eV or more. Alternatively, the work function of a material included in the floating electrode is preferably higher than the electron affinity of the semiconductor layer by 0.6 eV or more.

By employing any of the above structures, at least one of the above objects can be achieved. A function effect of an FET of one embodiment of the present invention will be described below with reference to drawings. Terms used below are basically the same as the terms used in the above description. Therefore, conditions for the components denoted by the terms used in the above description may be applied to components denoted by the same terms. For example, in the case where a source electrode is described below, the work function thereof may be in the range given in the above description.

FIGS. 1A to 1C illustrate an example of an FET of one embodiment of the present invention. The FET in FIG. 1A includes the semiconductor layer 101, the source electrode 103a and the drain electrode 103b on one surface of the semiconductor layer 101, and the gate 105 over the opposite surface of the semiconductor layer 101. Further, a floating electrode 102 enclosed by the insulator 104 is provided between the semiconductor layer 101 and the gate 105.

The floating electrode 102 is not in contact with a conductor in the outside (in a floating state). In the case where electric charge is accumulated in the floating electrode 102, the electric charge can be held for an extremely long time. The floating electrode 102 is similar to a floating gate of a known erasable programmable ROM (EPROM). However, in the FET illustrated in FIGS. 1A to 1C, accumulation of electric charge in the floating electrode 102 is performed only in the manufacturing process.

In order to accumulate electric charge in the floating electrode 102, sufficiently high voltage may be applied to the gate 105 and one or both of the source and drain electrodes 103a and 103b. When voltage is applied with the FET irradiated with visible light, electric charge can be accumulated even with lower voltage. In addition, voltage may be applied while the FET is irradiated with ultraviolet light with energy higher than the bandgap of the semiconductor layer.

In the case where the FET is an n-channel FET, the floating electrode 102 is negatively charged; in the case where the FET is a p-channel FET, the floating electrode 102 is positively charged.

In either case, it is not necessary to perform removal of electric charge in the floating electrode 102 or accumulation of electric charge again after the FET is manufactured; therefore, it is not necessary to perform irradiation with visible light or ultraviolet light again or application of high voltage. Accordingly, there is no need to provide a structure with which the FET is exposed to visible light or ultraviolet light or a circuit for generating high voltage, in a semiconductor circuit or semiconductor device including the FET.

For example, the floating electrode 102 may be charged with the use of ultraviolet light, and then the semiconductor circuit including the FET may be sealed in a light-blocking package. It is particularly preferable that the FET be not exposed to light. Accordingly, electric charge can be prevented from leaking from the floating electrode 102, so that characteristics of the FET can be stabilized.

In order to charge the floating electrode 102 with the use of high voltage, high voltage may be applied to the FET in the semiconductor circuit from a device for supplying voltage, through a pad provided in the semiconductor circuit. After the floating electrode 102 is charged, the semiconductor circuit may be sealed in a light-blocking package.

In any case, there is limitation on the number of times of charging the floating electrode 102. Since excessively high voltage is not used in the case of using ultraviolet light, significantly limited damage is done to the insulator 104 and thus electric charge accumulated in the floating electrode 102 is held for a long time.

FIG. 1B illustrates the case where the FET is an n-channel FET. As illustrated in FIG. 1B, the floating electrode 102 is negatively charged. Therefore, electrons flowing into the semiconductor layer 101 from the source electrode 103a and the drain electrode 103b are influenced by the floating electrode 102. It is apparent from comparison with FIG. 2B that a region with a high electron concentration recedes or shrinks.

As a result, in FIG. 2B, the region 101d is not divided on the surface opposite to the gate 105 in the semiconductor layer 101, whereas in FIG. 1B, the region 101d is divided and insulation between the source electrode 103a and the drain electrode 103b is significantly improved. That is, the zero current can be reduced, which is apparent from results of calculation shown in FIG. 1C.

A curve 111 in FIG. 1C is an $I_D$-$V_G$ curve in the case where the floating electrode 102 is not charged and corresponds to the curve 114 in FIG. 2C. When $V_G$ is 0 V, the drain current (zero current) is approximately $1\times10^{-10}$ A. However, when the floating electrode 102 is appropriately charged, a curve 112 is obtained and the zero current is reduced to $1\times10^{-24}$ A.

Furthermore, when the floating electrode 102 is excessively charged, a curve 113 is obtained and the zero current is approximately $1\times10^{-29}$ A, which is lower than that in the case of the curve 112; however, the threshold voltage is increased and high voltage needs to be applied to the gate in order to obtain sufficient on-state current. Application of high voltage may cause an overload to the semiconductor circuit and thus is preferably performed exclusively for a particular purpose. Note that the curves in FIG. 1C are shown for clear explanation of change in characteristics of the FET and are not obtained by actual measurement.

The required value of zero current depends on the intended use of the FET. For example, in a logic circuit such as an inverter, the zero current may be $1\times10^{-12}$ A or lower for a reduction in power consumed by tunneling current, and does not need to be $1\times10^{-15}$ A or lower usually. In contrast, for application to a memory in which data is stored semi-permanently described later, the zero current needs to be $1\times10^{-21}$ A or lower, preferably $1\times10^{-24}$ A or lower.

By minutely adjusting the amount of electric charge, characteristics of a plurality of FETs can be made uniform. As is apparent from the above description, the zero current or the threshold voltage of an FET including a conductor-semiconductor junction changes depending on the thickness of a semiconductor layer, the thickness of a gate insulating film, the channel length, or the like. It is difficult to equalize such values among all FETs, and variation among the FETs is inevitable. Thus, variation in the zero current or the threshold voltage is caused among FETs.

Variation in characteristics among FETs also depends on conditions of the manufacturing process, or the like. In the case of using an oxide semiconductor as a semiconductor, for example, a semiconductor layer is formed by a sputtering method in many cases. Even when the same target is used, a semiconductor layer formed using the one which has just started being used (new one) may be slightly different from a semiconductor layer formed using the one used for a long time.

Such variation in characteristics can be reduced by adjusting the amount of electric charge accumulated in the floating electrode 102 of each FET. Consequently, it is possible to use an FET that would be conventionally a defective product. Such a method is effective particularly in a highly integrated semiconductor circuit. In other words, when one FET is defective in a highly integrated circuit, there is limitation on a means for replacing the FET and thus the entire semiconductor circuit might be defective. That is, yield is decreased. When a potentially defective FET is saved by the above method, yield is improved.

The above effect is remarkable when the force of the floating electrode 102 for eliminating electrons from the semiconductor layer 101 is stronger than the force of the source electrode 103a or the drain electrode 103b for injecting electrons into the semiconductor layer 101. The strength of the forces depends on the work function or the electron affinity.

Specifically, the work function of the floating electrode 102 is preferably higher than the work function of the source electrode 103a or the drain electrode 103b by 0.6 eV or more. Alternatively, the work function of the floating electrode 102 is preferably higher than the electron affinity of the semiconductor layer by 0.6 eV or more.

In general, by using a material with a high work function, sufficiently low zero current can be obtained even when the amount of electric charge accumulated in the floating electrode 102 is small. However, even in the case of using a material with a low work function, sufficiently low zero current can be obtained by increasing the amount of electric charge accumulated in the floating electrode 102; therefore, no problem arises in normal use. Note that use of a material with a high work function can make it difficult for accumulated electric charge to leak, and thus is effective in preventing deterioration in characteristics of the FET left under high temperature for a long time.

When the work function of a material used for the floating electrode 102 is higher than the work function of a material used for the gate 105 or the semiconductor layer 101, the floating electrode 102 can be charged more effectively in a step of charging the floating electrode 102.

In the case where the floating electrode 102 is negatively charged, electrons are moved from a channel formed on a surface of the semiconductor layer 101 to the floating electrode 102 by application of positive voltage to the gate 105. At this time, an electron that has once entered the floating electrode 102 moves out to the gate 105 in some cases.

In that case, when a material for the floating electrode 102 has a high work function, the conduction band of the insulator 104 is higher; accordingly, the probability that an electron that has entered the floating electrode 102 moves out to the gate 105 is reduced. Therefore, the floating electrode 102 can be effectively charged.

A similar effect can be obtained by setting the thickness of the insulator 104 between the floating electrode 102 and the gate 105 to be larger than the thickness of the insulator 104 between the floating electrode 102 and the semiconductor layer 101. In that case, however, the capacitance between the gate 105 and the semiconductor layer 101 is decreased and thus the on-state current is decreased.

FIG. 3A three-dimensionally illustrates the FET in FIG. 1A. FIG. 3B is a cross-sectional view illustrating a plane including line A-A' and line B-B' in FIG. 3A, and corresponds to FIG. 1A. In addition, FIG. 3C is a cross-sectional view illustrating a plane including line B-B' and line D-D' in FIG. 3A (point D' exists behind the FET and is not shown in FIG. 3A).

As illustrated in FIG. 3C, the length $W_F$ of the floating electrode 102 needs to be larger than the channel width W of the FET so that the floating electrode 102 covers both ends of the semiconductor layer 101 in the channel width direction. On the other hand, although the width LF of the floating electrode 102 is larger than the channel length L of the FET in FIG. 3B, one embodiment of the present invention is not limited to the structure. For example, the width LF of the floating electrode 102 may be smaller than the channel length L of the FET. Note that at least one end of the floating electrode 102 needs to be positioned between the source electrode 103a and the drain electrode 103b.

In order to obtain sufficiently low zero current in accordance with one embodiment of the present invention, the carrier concentration of the semiconductor layer is preferably $10^{12}/cm^3$ or lower in the state where the semiconductor layer is not in contact with a conductor. Note that when the semiconductor layer is in contact with a conductor, carriers are injected from or absorbed in the conductor in the vicinity of the conductor as described above; for that reason, it is difficult to obtain the original carrier concentration of the semiconductor layer. Therefore, the carrier concentration of the semiconductor layer needs to be measured at a position which is sufficiently distanced (at least 100 μm away) from the conductor.

As for the above description, in the case where the semiconductor layer 101 is an oxide semiconductor, oxygen deficiency and hydrogen concentration are preferably reduced as much as possible. This is because oxygen deficiency or inclusion of hydrogen is a source of carriers. Further, inclusion of hydrogen causes unstable operation of the FET. The hydrogen concentration is preferably $10^{18}/cm^3$ or lower.

Although an FET including a conductor-semiconductor junction is discussed above, one embodiment of the present invention can also be applied to an FET in which the carrier concentration has a gradient. Especially in an FET in which a PN junction cannot be used for separation between a source and a drain, the source and the drain can be separated in accordance with one embodiment of the present invention.

In a junction between a conductor and a semiconductor, as described above, electrons are supplied from the conductor to the semiconductor or electrons are absorbed by the conductor from the semiconductor, depending on the work function, the electron affinity, or the like. A similar phenomenon occurs between a region with a high carrier concentration and a region with a low carrier concentration.

For example, it is assumed that there are two regions, a first region and a second region and that the electron concentration in the first region is $1\times10^{20}/cm^3$ and the electron concentration in the second region is $1\times10^{12}/cm^3$. In that case, the Fermi level of the first region exists in the vicinity of a lower end of the conduction band in a band diagram, while the Fermi level of the second region exists in the vicinity of the center of the bandgap. That is, most electrons in the first region have a higher potential energy than electrons in the second region.

If the first region and the second region are joined, the electrons in the first region flow into the second region owing to a difference in the potential energy. Assuming that the electron concentration in the first region is as relatively high as $1\times10^{20}/cm^3$, electrons are thought to be supplied in a manner similar to that in the case where the second region is in contact with a conductor; thus, the electrons flow into a considerably deep portion of the second region.

The depth to which the electrons flow depends on a difference between the Fermi level of the second region and the Fermi level of the first region, that is, a ratio of the electron concentration in the second region to the electron concentration in the first region. When the electron concentration in the second region is lower, electrons are injected from the first region into a deeper portion of the second region. Needless to say, electrons injected in such a manner cause an increase in the zero current.

In particular, when the case of silicon and the case of a semiconductor having a wider bandgap than silicon are compared, electrons are injected into a deeper portion of the second region in the latter case. This is because, in the latter case, the bandgap is wider and thus the difference between the Fermi level of the first region and the Fermi level of the second region is larger.

In order to prevent such flow of carriers from a region including carriers at a high concentration, the charged floating electrode described above may be provided so that entry of electrons is prevented and a region with an extremely low electron concentration is formed in the semiconductor layer. The principle is similar to that illustrated in FIG. 1B.

The work function of a conductor is discussed in the above description. The work function of a conductor may be a value determined by an interface with a semiconductor in a simplest assumption; however, a complex physical property such as generation of a compound of the semiconductor and the conductor due to chemical reaction or a trap of electric charge or another element is often observed at the interface in reality.

In the case where a semiconductor layer, a first conductor layer with an extremely small thickness of several nanometers or less, and a second conductor layer with a relatively large thickness are stacked in this order, for example, an influence of the work function of the first conductor layer is considerably reduced. Therefore, in application of one embodiment of the present invention, the design may be performed so that the work function of each material at a position that is 5 nm away from an interface between the semiconductor layer and the first conductor layer satisfies favorable conditions of one embodiment of the present invention.

One embodiment of the present invention is particularly effective for a semiconductor material in which substantially only one of an electron and a hole can be used as a carrier (a semiconductor material whose conductivity type cannot be controlled by doping). In other words, a favorable result can be obtained in accordance with one embodiment of the present invention, for example, in the case where the mobility of one of the electron and the hole is 1 cm$^2$/Vs or higher whereas the mobility of the other is 0.01 cm$^2$/Vs or lower, the other does not exist as a carrier, or the effective mass of the other is 100 times or more as large as that of a free electron.

BEST MODE FOR CARRYING OUT THE INVENTION

Figure 1A:
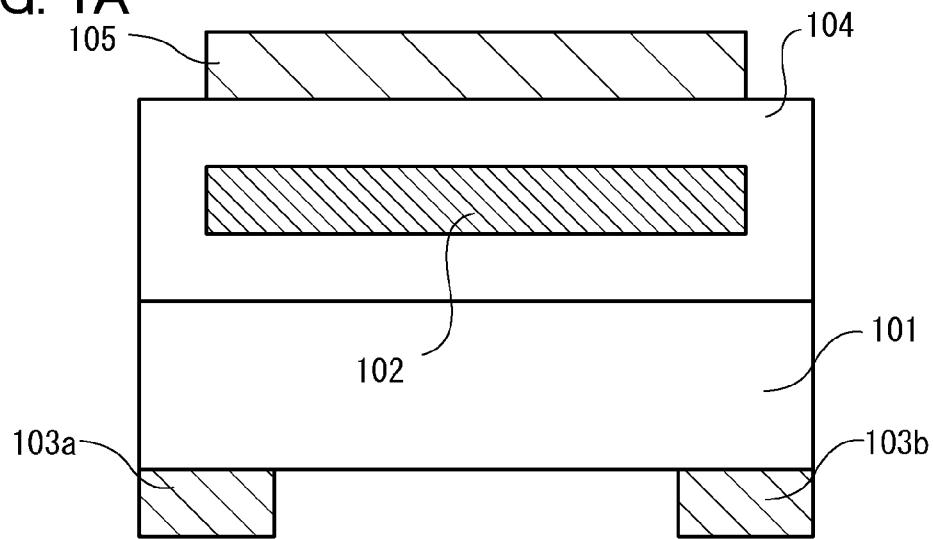
FIGS. 1A to 1C illustrate an example of an FET of one embodiment of the present invention and a principle of operation thereof.
Figure 1B:
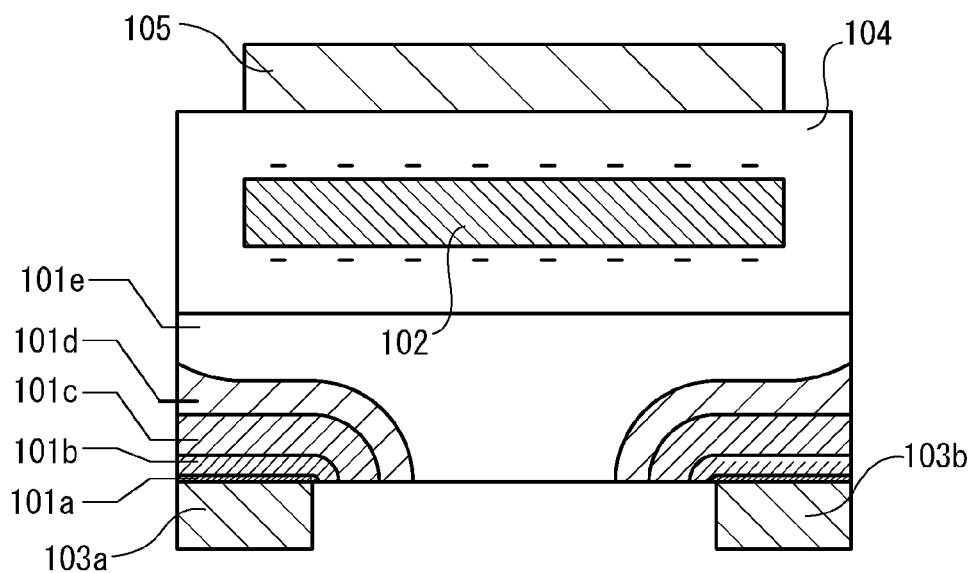
Figure 1C:
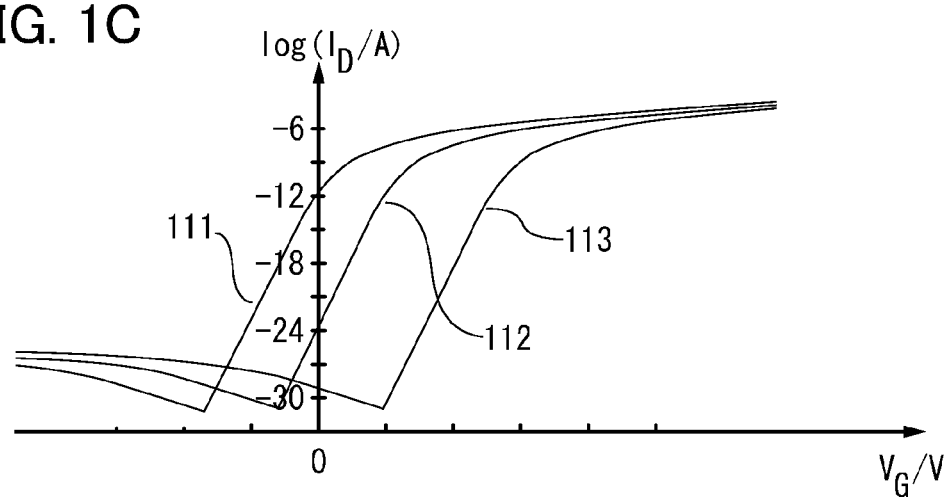
Figure 2A:
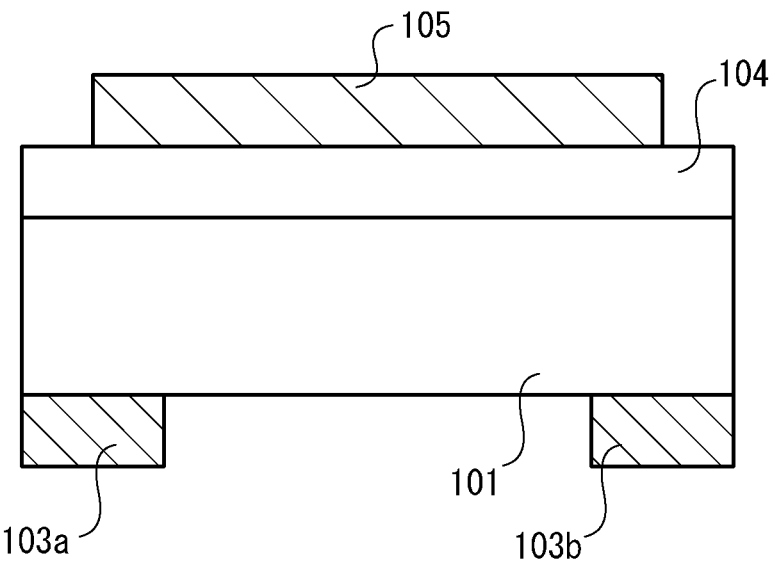
FIGS. 2A to 2C illustrate an example of a conventional FET and operation thereof.
Figure 2B:
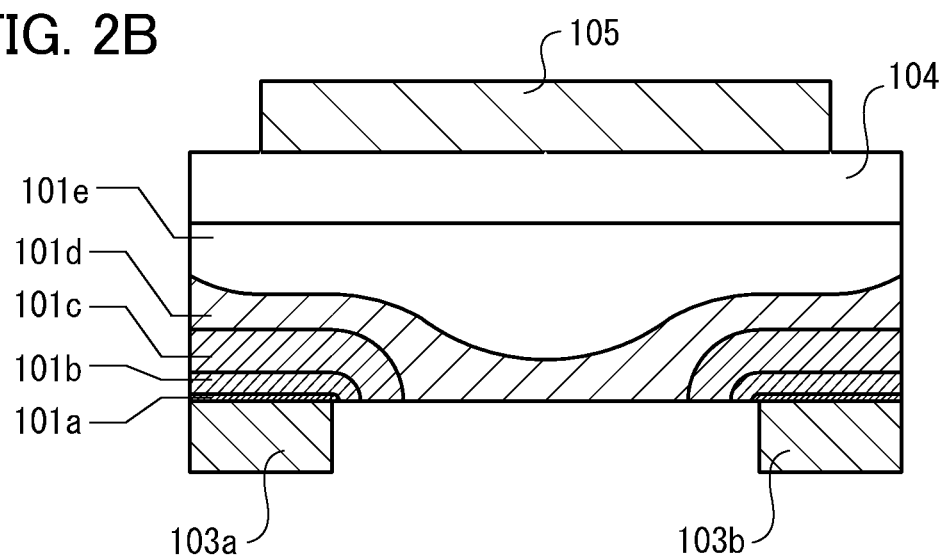
Figure 2C:
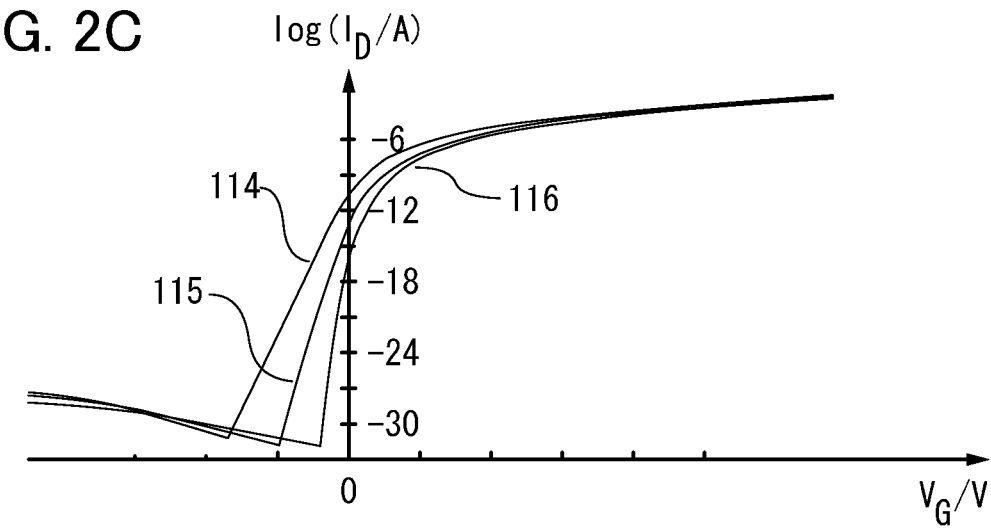
Figure 3A:
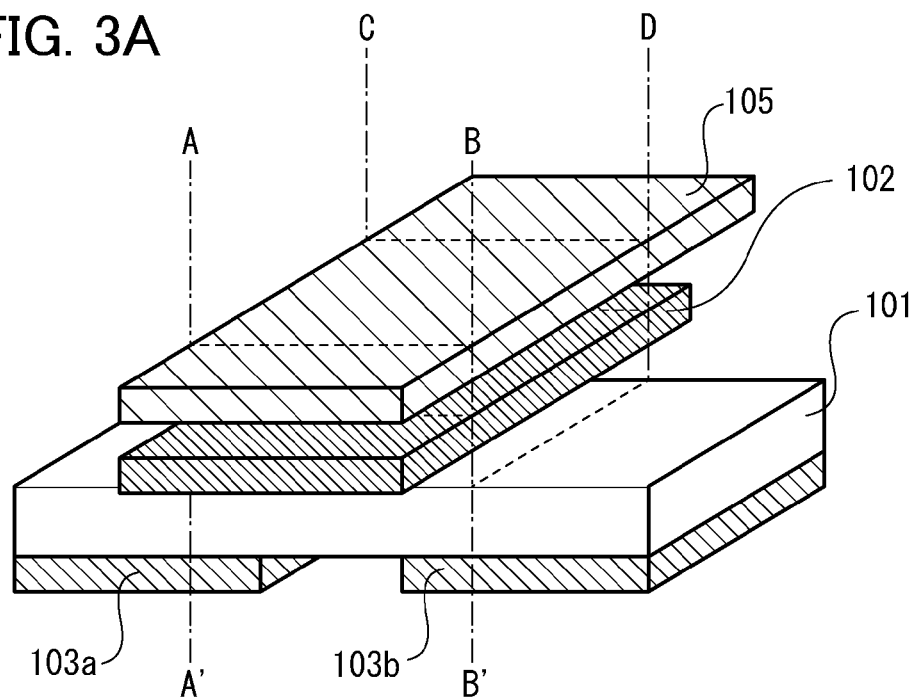
FIGS. 3A to 3C illustrate an example of an FET of one embodiment of the present invention.
Figure 3B:
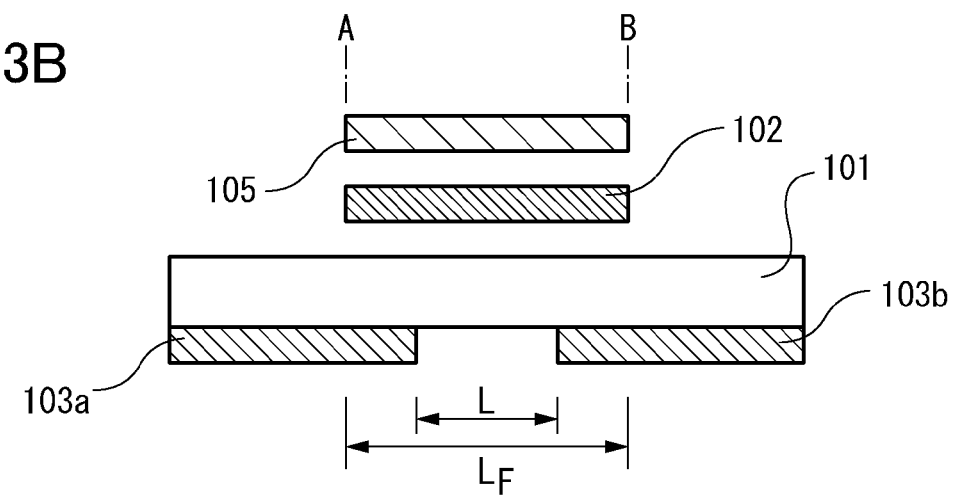
Figure 3C:
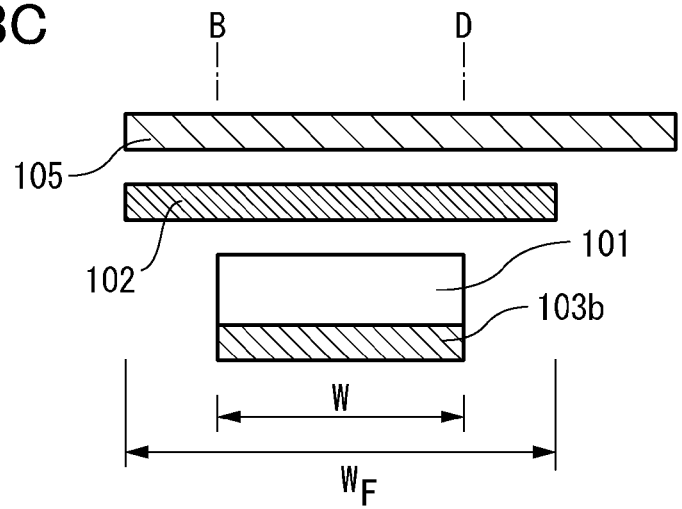

Hereinafter, embodiments of the present invention will be described in detail with reference to drawings. Note that the present invention is not limited to the description below, and it is easily understood by those skilled in the art that modes and details can be modified in various ways. Therefore, the present invention is not construed as being limited to the description of the embodiments below.

The structures, the conditions, and the like disclosed in any of the following embodiments can be combined with those disclosed in other embodiments as appropriate. Note that in structures described below, the same portions or portions having similar functions are denoted by the same reference numerals in different drawings, and detailed description thereof is not repeated in some cases.

An oxide in this specification is a substance (including a compound) in which the proportion of nitrogen, oxygen, fluorine, sulfur, selenium, chlorine, bromine, tellurium, and iodine (in a molar ratio) is higher than or equal to 25% of the total and the proportion of oxygen to the above elements (in a molar ratio) is higher than or equal to 70%.

A metal element in this specification refers to all elements other than a rare gas element, hydrogen, boron, carbon, nitrogen, a Group 16 element (e.g., oxygen), a Group 17 element (e.g., fluorine), silicon, phosphorus, germanium, arsenic, and antimony.

(Embodiment 1)

Figure 4A:
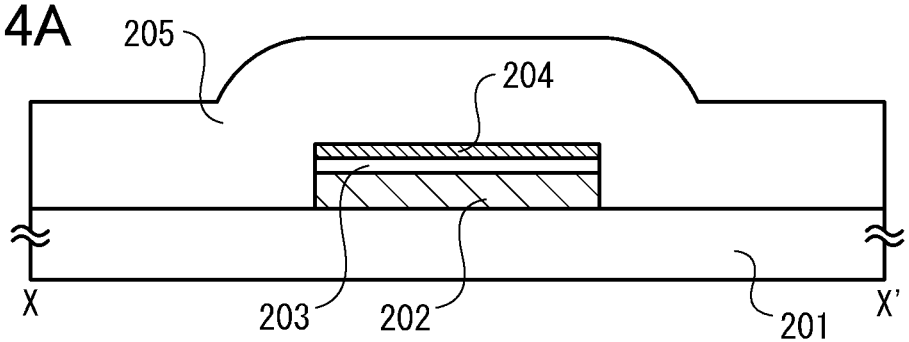
FIGS. 4A to 4D illustrate a manufacturing process of an FET according to Embodiment 1.

This embodiment will be described with reference to FIGS. 4A to 4D, FIGS. 5A to 5D, and FIGS. 6A to 6C. First, a conductive film, an insulating film, and a conductive film are formed over a substrate 201 and are selectively etched, so that a gate 202, a first gate insulating film 203, and a floating electrode 204 are formed as illustrated in FIG. 4A. A variety of substrates can be given as examples of the substrate 201, but the substrate 201 needs to have such a property as to withstand subsequent treatment. Further, it is preferable that a surface of the substrate 201 has an insulating property. Accordingly, the substrate 201 is preferably a single insulator; an insulator, conductor, or semiconductor whose surface is provided with an insulating layer; or the like.

As the insulator, various kinds of glasses, sapphire, quartz, ceramics, or the like can be used. As the conductor, aluminum, copper, stainless steel, silver, or the like can be used. As the semiconductor, silicon, germanium, silicon carbide, gallium nitride, or the like can be used. In this embodiment, barium borosilicate glass is used as the substrate 201.

As a material for the gate 202, a conductor such as a variety of metal materials or a conductive oxide can be used. The gate 202 may be formed using such a material alone or may have a multilayer structure. In this embodiment, a 250-nm-thick multilayer film having a three-layer structure of titanium/aluminum/titanium formed by a sputtering method is used.

Note that it is conventionally preferable to use a material with a high work function for a gate in terms of a reduction in the zero current. This is because a material with a high work function has a strong force for eliminating electrons in a semiconductor layer. In this embodiment, however, the floating electrode 204 is charged to be used and thus the work function of the gate 202 has little influence.

In many cases, a material with a high work function has a problem of expensiveness, difficulty in deposition, poor conductivity, or the like and such a problem inhibits its practical use. In this embodiment, even with a material which is inexpensive, easily deposited, and excellent in conductivity, sufficiently low zero current can be obtained.

As a material for the first gate insulating film 203, silicon oxide, aluminum oxide, aluminum nitride, hafnium oxide, lanthanum oxide, yttrium oxide, or the like can be used. It is preferable that the first gate insulating film 203 have such a thickness that electric charge does not leak from the floating electrode 204 when an FET is used later. In this embodiment, as a material for the first gate insulating film 203, silicon oxynitride deposited by a CVD method to a thickness of 30 nm to 100 nm is used.

As a material for the floating electrode 204, a variety of conductive materials similar to that for the gate 202 can be used. In general, it is preferable to use, but not limited to, a material with a high work function. Note that some materials with a high work function do not have sufficient conductivity as described above; however, electrons move in a limited region of the floating electrode 204 (specifically, from one surface of the floating electrode to the opposite surface thereof), and thus such conductivity hardly causes a problem. In addition, the thickness of the floating electrode 204 may be 5 nm to 100 nm, preferably 10 nm to 30 nm.

Further, as illustrated in FIG. 4A, a thick insulator 205 is formed to cover the gate 202, the first gate insulating film 203, and the floating electrode 204. The insulator 205 is preferably formed using a method and a material with which excellent step coverage is obtained. For example, silicon oxide, silicon nitride, silicon oxynitride, or the like deposited by a CVD method or a spin coating method may be used as a material for the insulator 205. In addition, the thickness of the insulator 205 needs to be larger than at least the sum of the thicknesses of the gate 202, the first gate insulating film 203, and the floating electrode 204.

Figure 5A:
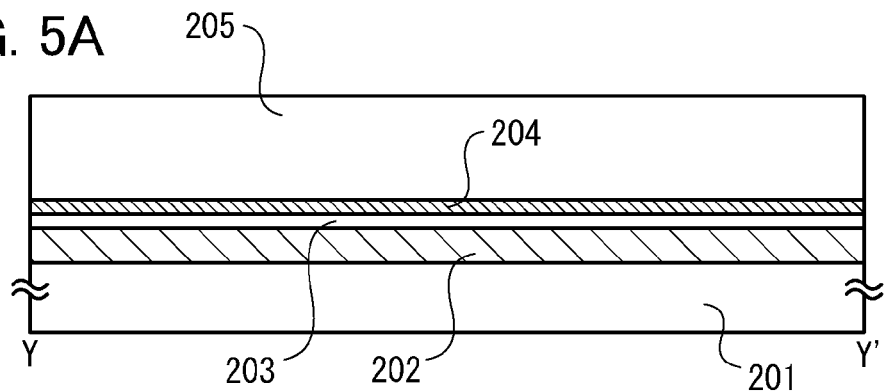
FIGS. 5A to 5D illustrate a manufacturing process of an FET according to Embodiment 1.
Figure 6A:
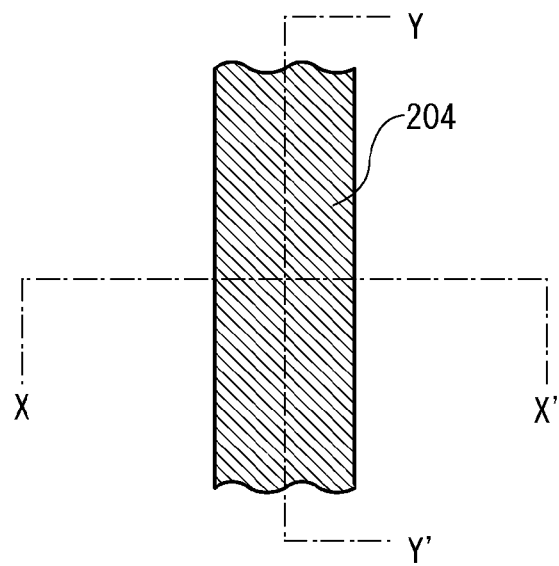
FIGS. 6A to 6C illustrate a manufacturing process of an FET according to Embodiment 1.
Figure 6B:
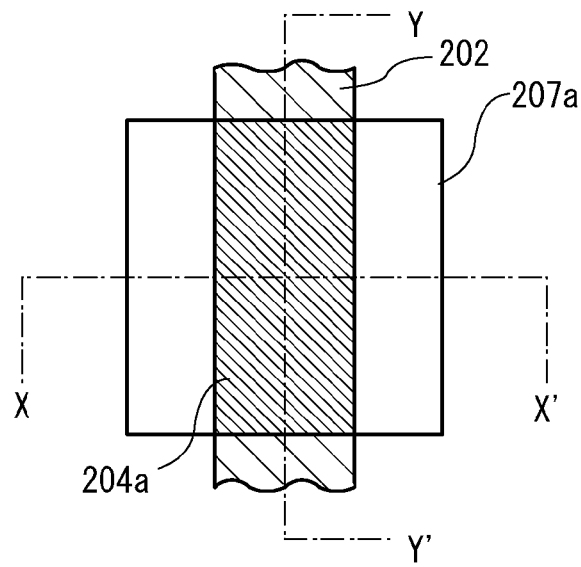
Figure 6C:
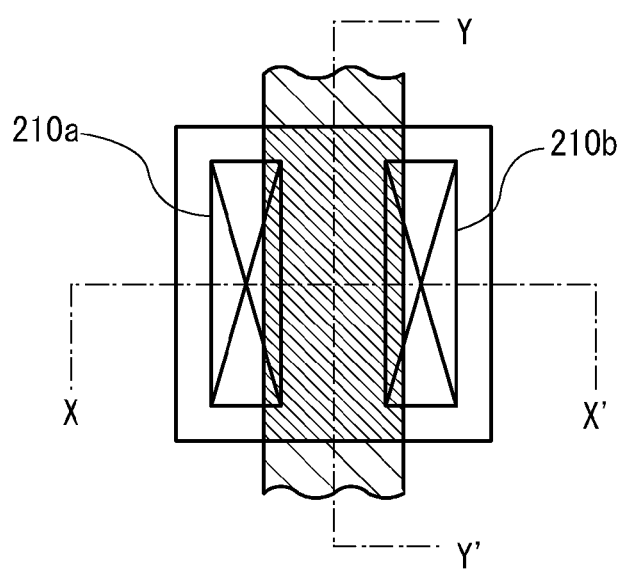
Figure 7A:
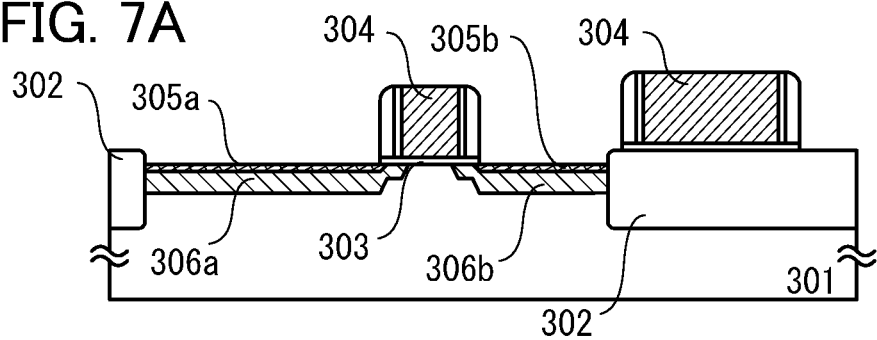
FIGS. 7A to 7D illustrate a manufacturing process of a semiconductor device including an FET, according to Embodiment 2.
Figure 7B:
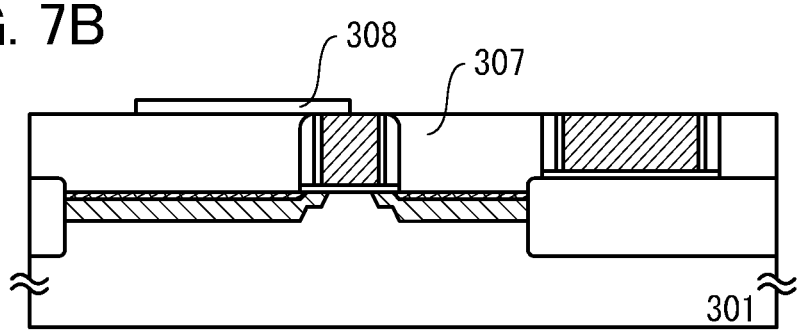
Figure 7C:
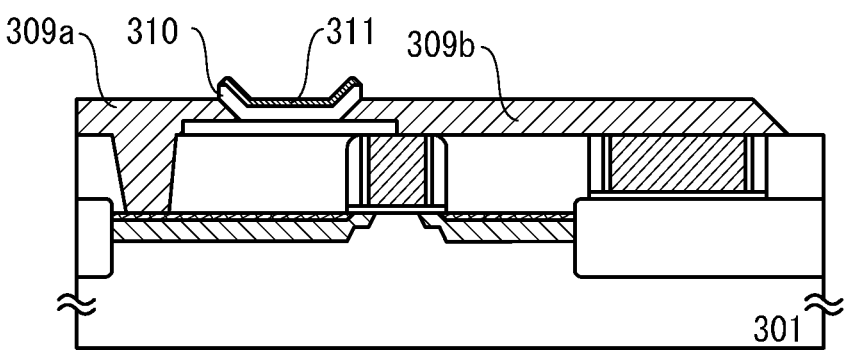
Figure 7D:
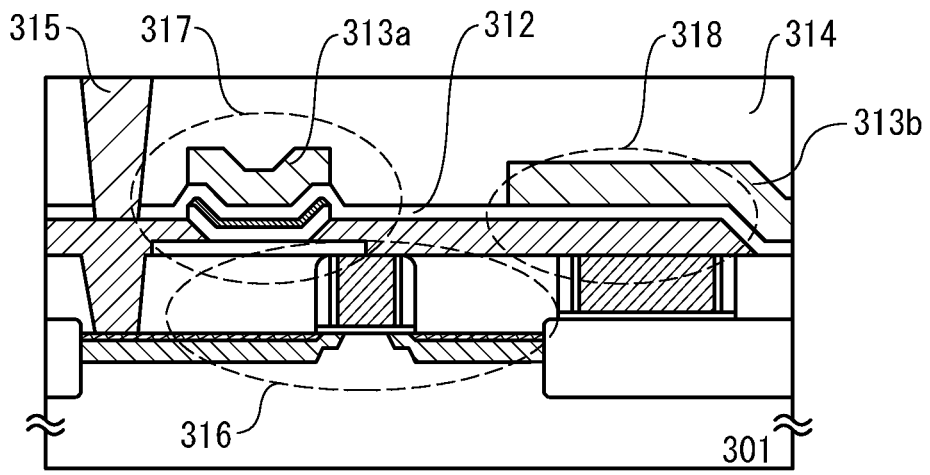

FIG. 6A illustrates a state where the FET whose cross section is illustrated in FIG. 4A is observed from the above. In FIGS. 6A to 6C, the insulator 205 is not illustrated. A cross section taken along X-X' in FIG. 6A is illustrated in FIG. 4A, and a cross section taken along Y-Y' in FIG. 6A is illustrated in FIG. 5A.

Then, a surface is planarized by a chemical mechanical polishing (CMP) method, for example. This polishing is preferably performed until a surface of the floating electrode 204 is exposed. In the case where the insulator 205 is formed by a spin coating method and the surface is already flat enough, for example, the CMP method does not need to be used and the insulator 205 may be etched by a normal dry etching method until the surface of the floating electrode 204 is exposed. Thus, the gate 202, the first gate insulating film 203, and the floating electrode 204 are embedded in an insulator 205a.

Figure 4B:
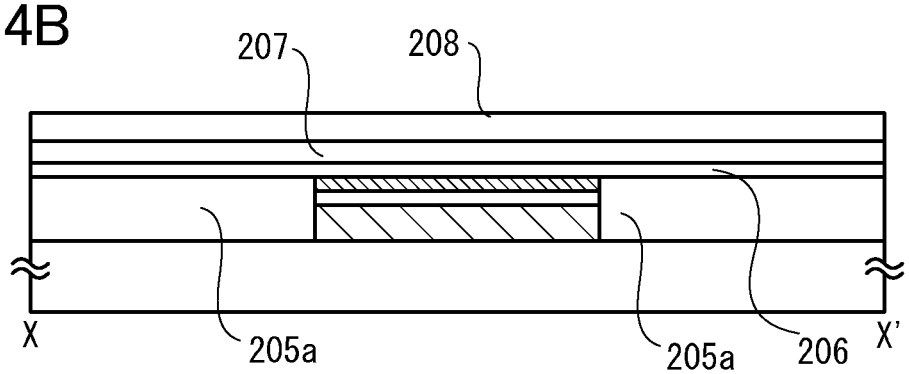

After that, as illustrated in FIG. 4B, a second gate insulating film 206, a semiconductor layer 207, and a protective insulating layer 208 are formed. These are formed over a sufficiently flat surface and therefore may be formed by a method with which the step coverage might become insufficient, such as a sputtering method. Further, the second gate insulating film 206, the semiconductor layer 207, and the protective insulating layer 208 need to be successively formed without the substrate 201 being exposed to the air during the formation. This is effective in preventing the semiconductor layer 207 from being exposed to the air, especially in preventing water vapor in the air from being absorbed by the semiconductor layer.

Note that the second gate insulating film 206 and the protective insulating layer 208 may be formed using the material used for the first gate insulating film 203, and each preferably have a sufficiently low hydrogen concentration. Therefore, it is preferable that the concentration of hydrogen and a compound including hydrogen (such as water) in an atmosphere for the film formation be sufficiently low.

The second gate insulating film 206 is preferably thin enough so that electric charge can be accumulated in the floating electrode 204 in a later step and thick enough so that electric charge does not leak from the floating electrode 204 when the FET is used later. In this embodiment, the thickness of the second gate insulating film 206 is 10 nm to 20 nm.

The protective insulating layer 208 is preferably as thick as possible unless a problem with productivity occurs. In addition, it is preferable that excess oxygen exist in the protective insulating layer. In this embodiment, the protective insulating layer 208 has a thickness of 50 nm to 100 nm.

Figure 5B:
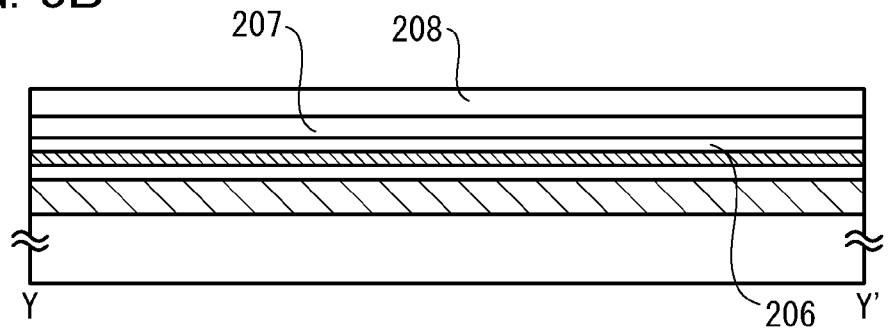

As a material for the semiconductor layer 207, an oxide semiconductor including In or Ga is used. Other than the above oxide semiconductor, a variety of oxide semiconductors can be used. In this embodiment, an In—Ga—Zn-based oxide film with a thickness of 5 nm to 20 nm is formed by a sputtering method using an oxide target including In, Ga, and Zn at the same rate. It is preferable that the hydrogen concentration of the semiconductor layer 207 be sufficiently low. Therefore, it is preferable that the concentration of hydrogen and a compound including hydrogen (such as water vapor) in an atmosphere for the film formation be sufficiently low. FIG. 5B illustrates a cross section taken along Y-Y' which is a cross section of the FET illustrated in FIG. 4B.

Figure 4C:
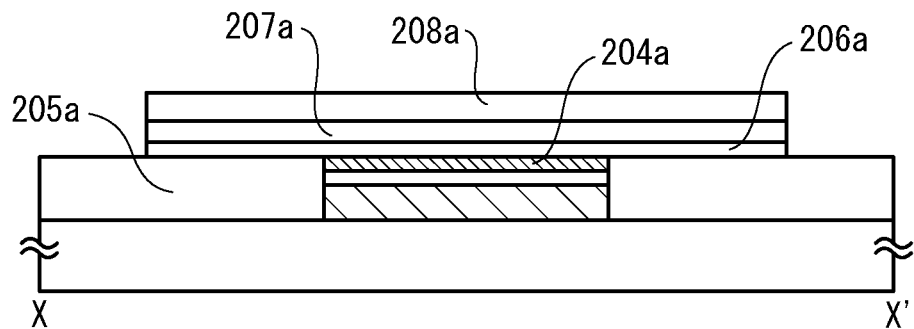
Figure 5C:
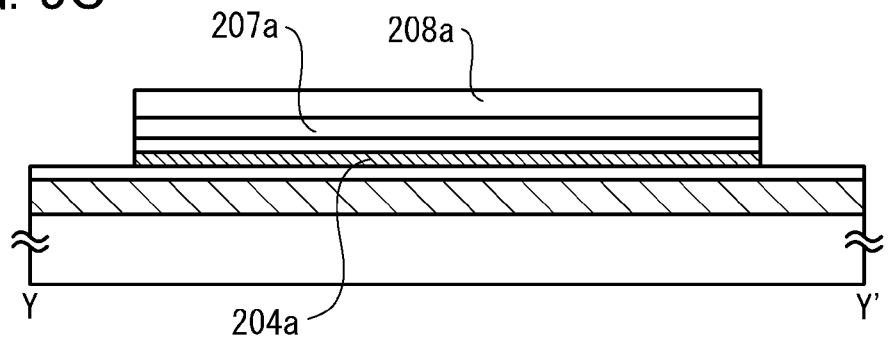

After that, the floating electrode 204, the second gate insulating film 206, the semiconductor layer 207, and the protective insulating layer 208 are selectively etched. As a result of etching, the shape of each of them is changed, so that a floating electrode 204a, a second gate insulating film 206a, a semiconductor layer 207a, and a protective insulating layer 208a are formed. FIG. 6B is a top view of the FET at this time. FIG. 4C illustrates a cross section taken along X-X' and FIG. 5C illustrates a cross section taken along Y-Y'. Note that the first gate insulating film 203, the insulator 205a, the second gate insulating film 206a, and the protective insulating layer 208a are not illustrated in FIGS. 6A to 6C.

The area and position of the semiconductor layer 207a are determined by this etching, and the etching is preferably performed in stages. A resist mask is formed over a portion serving as the semiconductor layer 207a so as to prevent the portion from being etched. First, the protective insulating layer 208, the semiconductor layer 207, and the second gate insulating film 206 are etched. They may be etched successively. By this etching, the second gate insulating film 206a, the semiconductor layer 207a, and the protective insulating layer 208a are formed, and the second gate insulating film 206a and the protective insulating layer 208a have substantially the same shape as the semiconductor layer 207a. In addition, part of the floating electrode 204 and part of the insulator 205a are exposed.

Next, the floating electrode 204 is etched. This etching is performed under the condition where the floating electrode 204 is preferentially etched. As a result, the insulator 205a is hardly etched. By this etching, the floating electrode 204 is etched and only the floating electrode 204a is left under the semiconductor layer 207a.

As seen in FIG. 6B, the floating electrode 204a is formed to have a shape aligned with the semiconductor layer 207a, that is, formed in a self-aligned manner; thus, the floating electrode 204a has substantially the same length as the semiconductor layer 207a in the channel width direction and overlaps with a region from one end of the semiconductor layer 207a to the other end thereof in the channel width direction. Such a structure is particularly effective in miniaturization.

After the above etching step, or after formation of the semiconductor layer 207 and before the etching step, proper heat treatment is preferably performed once or plural times. This heat treatment is performed to reduce the hydrogen concentration or oxygen deficiency in the semiconductor layer 207 or the semiconductor layer 207a.

Figure 4D:
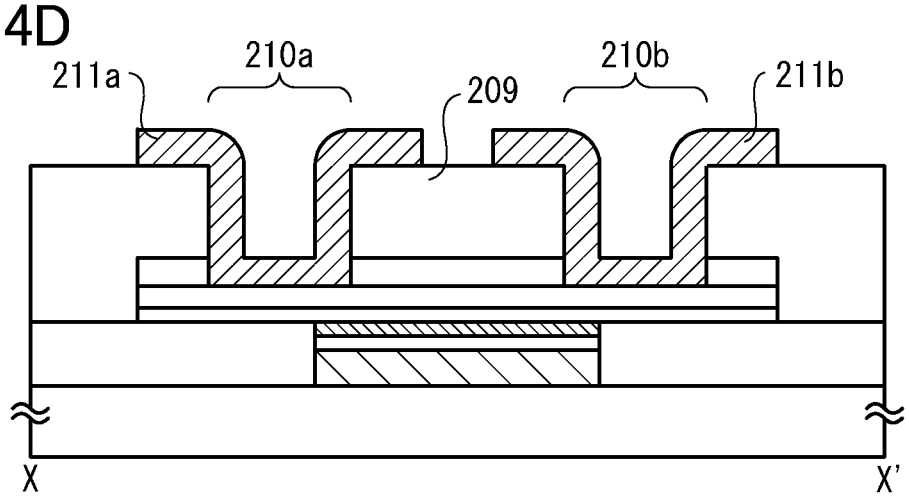
Figure 5D:
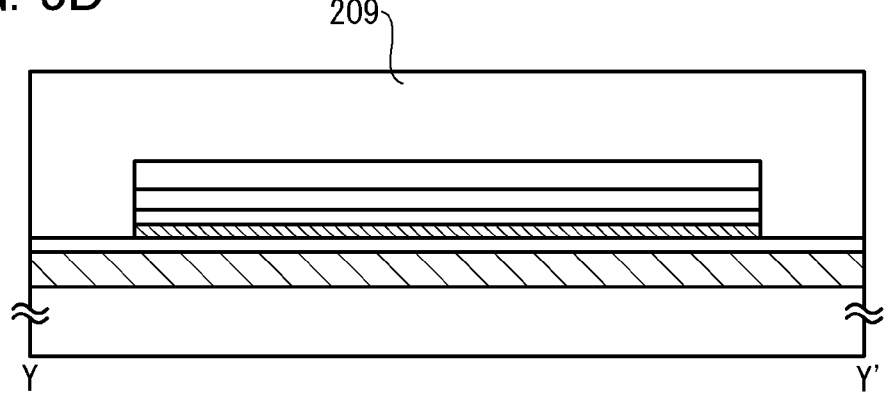

After that, an interlayer insulator 209 is formed (see FIG. 4D and FIG. 5D). The interlayer insulator 209 is formed using a single-layer or multilayer insulator, and can be formed using an inorganic insulator such as silicon oxide, silicon nitride, or silicon oxynitride or an organic insulator such as polyimide, which is deposited by a sputtering method, a CVD method, a spin coating method, or the like.

For example, a silicon oxide film with an extremely low hydrogen concentration may be formed to a thickness of 50 nm to 200 nm by a sputtering method first, and then a polyimide film may be formed to a thickness of 500 nm to 1 μm by a spin coating method. A spin coating method is preferably used because a flat surface can be obtained.

Next, as illustrated in FIG. 4D and FIG. 6C, contact holes 210a and 210b are formed in the interlayer insulator 209. Note that the interlayer insulator 209 is not illustrated in FIG. 6C. Then, a conductive film of metal or the like is formed and selectively etched, so that a source electrode 211a and a drain electrode 211b are formed.

As a material used for the source electrode 211a and the drain electrode 211b, a variety of metal materials, a conductive oxide, and the like can be given. In the above manner, an FET including the floating electrode 204a is completed.

(Embodiment 2)

In this embodiment, a method for manufacturing a semiconductor circuit where an FET including silicon and an FET which is formed thereover and includes a different semiconductor layer and a floating electrode are provided will be described with reference to FIGS. 7A to 7D. First, with the use of a known technique for manufacturing a silicon MOSFET, an element isolation region 302 is formed in a silicon substrate 301, and a silicon FET including a gate insulating film 303, a gate 304, a source 306a, and a drain 306b is formed. The gate 304 may be provided with a sidewall as illustrated in the drawing. The gate 304 extends over the element isolation region. Further, silicide layers 305a and 305b may be provided on surfaces of the source 306a and the drain 306b in order to increase the conductivity (see FIG. 7A).

After that, an insulator is formed and a surface thereof is polished by a CMP method, so that an insulator 307 with a flat surface is obtained. The CMP is preferably performed until a surface of the gate 304 is exposed. Further, an oxide semiconductor film is formed and etched, so that an oxide semiconductor layer 308 having a desired shape (e.g., an island shape) is formed (see FIG. 7B).

Then, a contact hole reaching the source 306a is formed, a conductive film is formed, a surface of the conductive film is planarized, and then selective etching is performed; thus, a first electrode 309a and a second electrode 309b are formed. Further, an insulating film and a conductive film are formed and etched, so that a first gate insulating layer 310 and a floating electrode 311 are formed (see FIG. 7C). Note that the first gate insulating layer 310 in this embodiment corresponds to the second gate insulating film 206a in Embodiment 1.

After that, a second gate insulating layer 312 is formed. A conductive film is formed and selectively etched, so that a wiring 313a and a wiring 313b are formed. The wiring 313a also serves as a gate of an FET 317 including an oxide semiconductor as a semiconductor layer. The wiring 313b is included in a capacitor 318 in which the second gate insulating layer 312 serves as a dielectric between the wiring 313b and the second electrode 309b (see FIG. 7D).

Further, an interlayer insulator 314 is formed, a contact hole is formed therein, and a contact plug 315 reaching the first electrode 309a is embedded. A wiring connected to the contact plug 315 may be additionally provided. Through the above steps, a semiconductor circuit including a silicon MOSFET 316, the FET 317 including an oxide semiconductor, and the capacitor 318 is formed (see FIG. 7D).

Figure 8A:
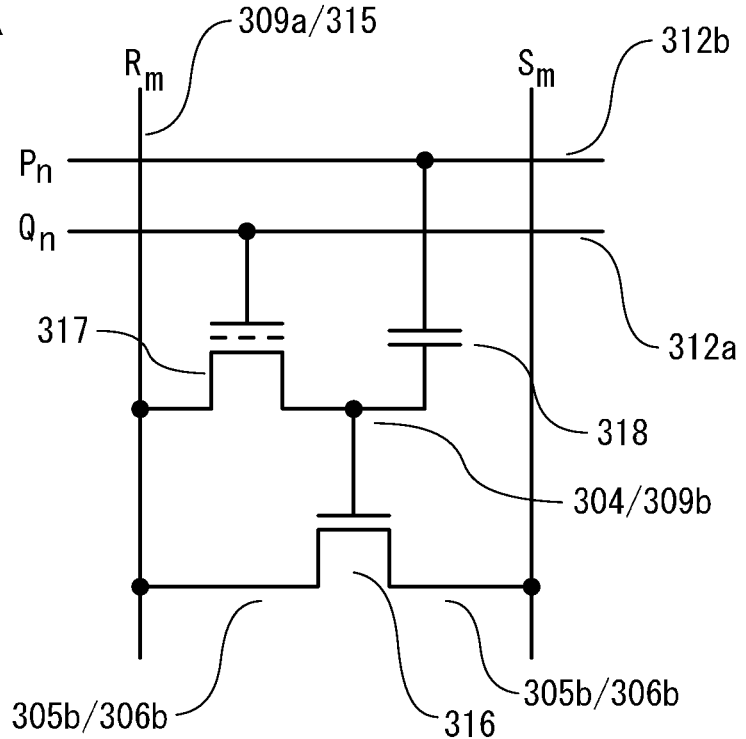
FIGS. 8A and 8B each illustrate a circuit of a semiconductor device including an FET, according to Embodiment 2.

Such a semiconductor circuit can be applied to a memory element illustrated in FIG. 8A. This memory element includes two FETs 316 and 317 and one capacitor 318. The drawing illustrates a memory element in the n-th row and the m-th column.

In writing data into the memory element, when the potential of a writing word line $Q_n$ is set to be high to turn on the FET 317 and data is given to a bit line $R_m$ at this time, electric charge for the data passes through the FET 317 and is accumulated in the capacitor 318.

In reading data from the memory element, the potential of a reading word line $P_n$ is set to be an appropriate level, whereby the FET 316 is turned on or off depending on the amount of electric charge accumulated in the capacitor 318; thus, data can be read by comparison between the potential of the bit line $R_m$ and the potential of a source line $S_m$.

Thus, data is not lost in reading. Therefore, data can be semipermanently stored when the zero current of the FET 317 is sufficiently low. In order to obtain sufficiently low zero current, the floating electrode 311 is negatively charged. Accordingly, the zero current of the FET 317 can be $1\times10^{-21}$ A or lower, preferably $1\times10^{-24}$ A or lower, and data can be held for an extremely long time.

In the memory element illustrated in FIG. 8A, data amplified by the FET 316 is read and thus the capacitance of the capacitor 318 can be $1\times10^{-16}$ F or lower, preferably $1\times10^{-17}$ F or lower; accordingly, the capacitor 318 can have a simple structure and a small area. For these reasons, the size of the memory element can be reduced as well and high integration can be achieved.

On the other hand, in the case of using the capacitor 318 with such low capacitance, data might be instantly lost if the zero current of the FET 317 is high. As described above, given that the zero current of the FET 317 is $1\times10^{-21}$ A, data can be held for only 1 day when the capacitance of the capacitor 318 is $1\times10^{-16}$ F, and data can be held for only 3 hours when the capacitance is $1\times10^{-17}$ F. Given that the zero current is $1\times10^{-24}$ A, data can be held for 3 years when the capacitance of the capacitor 318 is $1\times10^{-16}$ F, and data can be held a little more than 100 days even when the capacitance is $1\times10^{-17}$ F. Moreover, given that the zero current is $1\times10^{-26}$ A, data can be held for as long as 31 years even when the capacitance of the capacitor 318 is $1\times10^{-17}$ F.

Figure 8B:
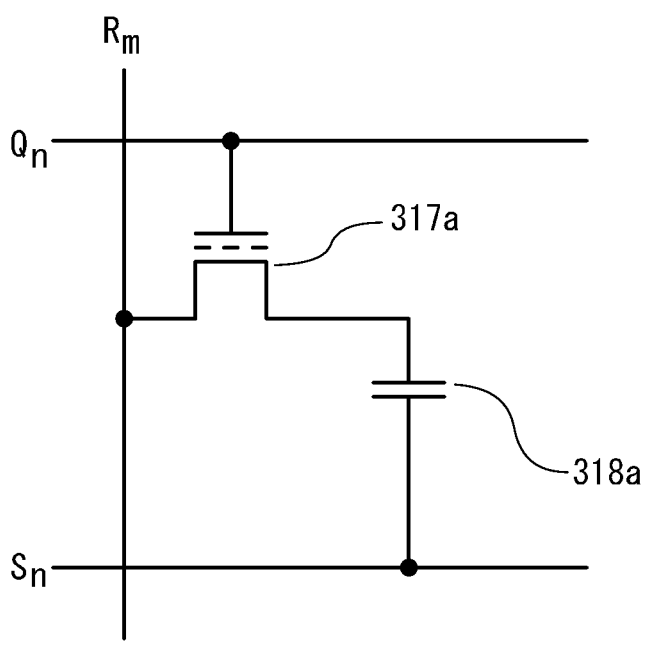

Meanwhile, by applying the manufacturing process illustrated in FIGS. 7A to 7D, a DRAM-type memory element including one FET 317a and one capacitor 318a may be formed as illustrated in FIG. 8B. In this memory element, the capacitor 318a needs to have a capacitance of $1\times10^{-15}$ F or higher in terms of prevention of noise; therefore, a stacked capacitor is preferably used.

Data writing is performed in the following manner data is given to the bit line $R_m$ when a high signal is supplied to the word line $Q_n$ to turn on the FET 317a, whereby electric charge is accumulated in the capacitor 318a. Data reading is performed in the following manner when a high signal is supplied to the word line $Q_n$ to turn on the FET 317a, the amount of electric charge released from the capacitor 318a to the bit line $R_m$ is measured. Note that a source line $S_n$ is kept at a constant potential in general, but may be supplied with a signal synchronized with that of the bit line $R_m$ or the word line $Q_n$.

Naturally, as the zero current of the FET 317a is lower, electric charge can be accumulated in the capacitor 318a for a longer time and thus data can be held for a longer time. For example, in the case where the capacitance of the capacitor 318a is $1\times10^{-15}$ F, data can be held for 11 days when the zero current of the FET 317a is $1\times10^{-24}$ A, and data can be held for 31 years or longer when the zero current is 1×10⁻²⁴ A or lower. In the latter case, substantially semipermanent data holding is possible.

(Embodiment 3)

Figure 9A:
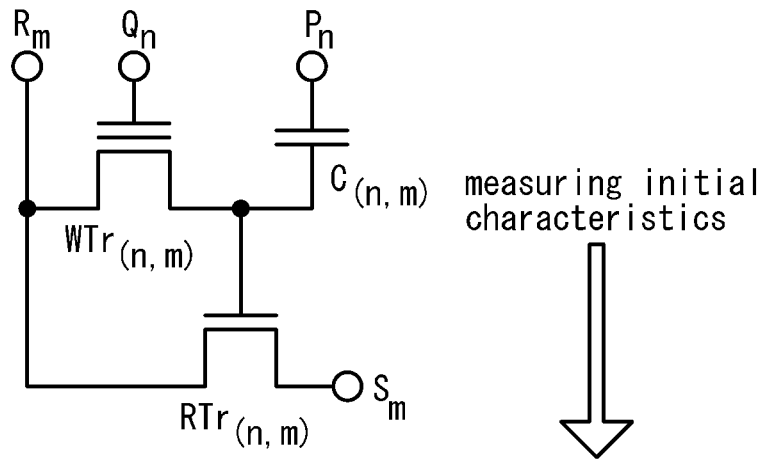
FIGS. 9A to 9C illustrate a manufacturing process of a semiconductor device including an FET, according to Embodiment 3.
Figure 9B:
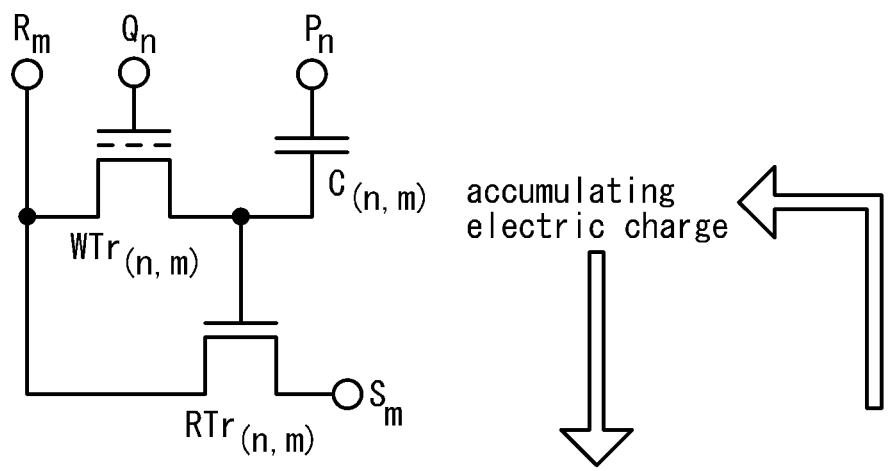
Figure 9C:
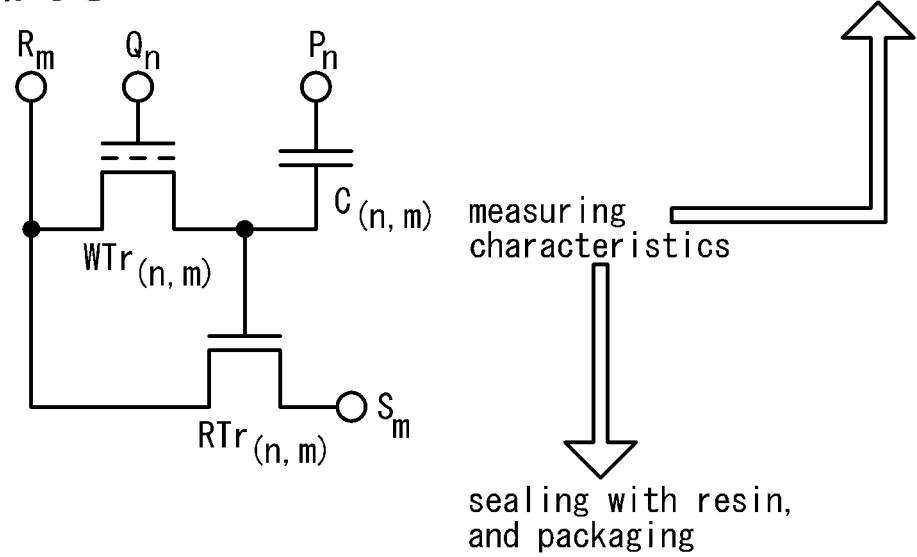

A method for manufacturing an FET is described in Embodiment 1 or 2. In Embodiment 3, a method for accumulating electric charge in a floating electrode will be described with reference to FIGS. 9A to 9C. In this embodiment, a method for accumulating electric charge in a memory element like the one illustrated in FIG. 8A will be described. Note that $RTr_{(n,m)}$, $WTr_{(n,m)}$, and $C_{(n,m)}$ in the memory element in FIGS. 9A to 9C correspond to the FET 316, the FET 317, and the capacitor 318 in FIG. 8A, respectively.

<FIG. 9A>

After a semiconductor circuit including the memory element is completed, initial characteristics of the memory element are measured first. At this stage, a floating electrode of $WTr_{(n,m)}$ is not charged. Here, whether the memory element functions as a memory element is judged, and characteristics of the memory element are recorded.

<FIG. 9B>

At this stage, electric charge is accumulated in the floating electrode of $WTr_{(n,m)}$. The amount of electric charge accumulated in the floating electrode of $WTr_{(n,m)}$ can be controlled by a potential difference between a gate and a source electrode (or a drain electrode) of $WTr_{(n,m)}$. Specifically, by controlling a potential difference between the writing word line $Q_n$ and the bit line $R_m$, electric charge accumulated in the floating electrode of $WTr_{(n,m)}$ of the memory element can be controlled. On the basis of results of the foregoing measurement, a proper amount of electric charge is accumulated in the floating electrode of $WTr_{(n,m)}$ of the memory element. Note that a sufficiently long time is ensured for accumulation of electric charge; therefore, an error in the amount of accumulated electric charge can be sufficiently reduced.

<FIG. 9C>

At this stage, characteristics of the memory element are measured again. When sufficient characteristics are obtained in a required number of memory elements, the semiconductor circuit is sealed with a resin or the like and packaged. If sufficient characteristics are not obtained in a required number of memory elements, a step of accumulating a proper amount of electric charge in the floating electrode is performed again on the basis of the measurement data.

By repeating such a cycle, semiconductor circuits and semiconductor devices (memory devices) can be manufactured at a high rate of non-defective products. Electric charge is accumulated using high voltage above, and voltage used for the accumulation may be supplied from an external circuit.

(Embodiment 4)

The semiconductor devices described in Embodiments 1 to 3 can be used in a variety of electronic devices typified by a semiconductor memory. Examples of such an electronic device include televisions, personal computers, communication devices such as mobile phones, electronic notebooks, and portable music players.

EXPLANATION OF REFERENCE

101: semiconductor layer, 102: floating electrode, 103a: source electrode, 103b: drain electrode, 104: insulator, 105: gate, 111: $I_D$-$V_G$ curve, 112: $I_D$-$V_G$ curve, 113: $I_D$-$V_G$ curve, 114: $I_D$-$V_G$ curve, 115: $I_D$-$V_G$ curve, 116: $I_D$-$V_G$ curve, 201: substrate, 202: gate, 203: first gate insulating film, 204: floating electrode, 204a: floating electrode, 205: insulator, 205a: insulator, 206: second gate insulating film, 206a: second gate insulating film, 207: semiconductor layer, 207a: semiconductor layer, 208: protective insulating layer, 208a: protective insulating layer, 209: interlayer insulator, 210a: contact hole, 210b: contact hole, 211a: source electrode, 211b: drain electrode, 301: substrate, 302: element isolation region, 303: gate insulating film, 304: gate, 305a: silicide layer, 305b: silicide layer, 306a: source, 306b: drain, 307: insulator, 308: semiconductor layer, 309a: first electrode, 309b: second electrode, 310: first gate insulating layer, 311: floating electrode, 312: second gate insulating layer, 313a: wiring, 313b: wiring, 314: interlayer insulator, 315: contact plug, 316: FET, 317: FET, 317a: FET, 318: capacitor, and 318a: capacitor.

This application is based on Japanese Patent Application serial no. 2010-197220 filed with the Japan Patent Office on Sep. 3, 2010, the entire contents of which are hereby incorporated by reference.

The invention claimed is:

1. A field effect transistor comprising:
    a semiconductor layer;
    first and second conductor electrodes in contact with a first surface of the semiconductor layer;
    a gate over the first surface or a second surface of the semiconductor layer; and
    a floating electrode between the semiconductor layer and the gate,
    wherein the floating electrode comprises a conductor or a semiconductor, is enclosed by an insulator, and is charged with a predetermined electric charge,
    wherein an amount of the predetermined electric charge in the floating electrode is not changed after charging,
    wherein the floating electrode is provided so as to cross the semiconductor layer, and
    wherein no PN junction exists in the field effect transistor.

2. A field effect transistor comprising:
    a semiconductor layer;
    first and second conductor electrodes in contact with a first surface of the semiconductor layer;
    a gate over the first surface or a second surface of the semiconductor layer; and
    a floating electrode between the semiconductor layer and the gate,
    wherein the floating electrode comprises a conductor or a semiconductor, is enclosed by an insulator, and is charged with a predetermined electric charge,
    wherein an amount of the predetermined electric charge in the floating electrode is not changed after charging,
    wherein the floating electrode is provided so as to cross the semiconductor layer, and
    wherein a conductor-semiconductor junction exists between each of the first and second conductor electrodes and the semiconductor layer.

3. The field effect transistor according to claim 1, wherein the semiconductor layer comprises an oxide in which a proportion of indium and zinc to all metal elements is 25% or higher.

4. The field effect transistor according to claim 2, wherein the semiconductor layer comprises an oxide in which a proportion of indium and zinc to all metal elements is 25% or higher.

5. The field effect transistor according to claim 1, wherein the semiconductor layer comprises an oxide having a bandgap greater than or equal to 3.0 eV and less than or equal to 4.5 eV.

6. The field effect transistor according to claim 2, wherein the semiconductor layer comprises an oxide having a bandgap greater than or equal to 3.0 eV and less than or equal to 4.5 eV.

7. The field effect transistor according to claim 1,
wherein the semiconductor layer comprises a first doped region and a second doped region,
wherein each of the first doped region and the second doped region includes a carrier at a higher concentration than the other region of the semiconductor layer,
wherein the first doped region is in contact with the first conductor electrode, and
wherein the second doped region is in contact with the second conductor electrode.

8. The field effect transistor according to claim 2,
wherein the semiconductor layer comprises a first doped region and a second doped region,
wherein each of the first doped region and the second doped region includes a carrier at a higher concentration than the other region of the semiconductor layer,
wherein the first doped region is in contact with the first conductor electrode, and
wherein the second doped region is in contact with the second conductor electrode.

9. The field effect transistor according to claim 7, wherein a carrier concentration of each of the first doped region and the second doped region is higher than or equal to $1\times10^{18}/cm^3$ and lower than $1\times10^{21}/cm^3$.

10. The field effect transistor according to claim 8, wherein a carrier concentration of each of the first doped region and the second doped region is higher than or equal to $1\times10^{18}/cm^3$ and lower than $1\times10^{21}/cm^3$.

11. A semiconductor device comprising:
a transistor comprising a semiconductor and a gate with a region therebetween; and
a cover with a light-blocking property over the transistor, wherein:
the region is charged with an electric charge,
the cover is provided after charging, and
an amount of the electric charge in the region is not changed after charging.

12. A semiconductor device comprising:
first and second transistors each comprising a semiconductor and a gate with a region therebetween; and
a cover with a light-blocking property over the first and second transistors,
wherein:
the region of each of the first and second transistors is charged with an electric charge in order that characteristics of the first and second transistors be uniform, and
the cover is provided after charging.

13. The semiconductor device according to claim 11, wherein the region comprises a conductor enclosed by an insulator.

14. The semiconductor device according to claim 12, wherein the region comprises a conductor enclosed by an insulator.

15. The semiconductor device according to claim 11, wherein the semiconductor comprises an oxide semiconductor containing indium, gallium and zinc.

16. The semiconductor device according to claim 12, wherein the semiconductor comprises an oxide semiconductor containing indium, gallium and zinc.

17. The semiconductor device according to claim 11, wherein:
the semiconductor has a first surface and a second surface opposite to the first surface,
a source and a drain of the transistor are in contact with the first surface, and
the region is between the second surface and the gate.

18. The semiconductor device according to claim 12, wherein:
the semiconductor has a first surface and a second surface opposite to the first surface,
a source and a drain of each of the first and second transistors are in contact with the first surface, and
the region is between the second surface and the gate.

19. A memory device comprising the semiconductor device according to claim 11.

20. A memory device comprising the semiconductor device according to claim 12.

* * * * *